(12) United States Patent
Murade

(10) Patent No.: US 7,164,408 B2
(45) Date of Patent: Jan. 16, 2007

(54) ELECTRO-OPTICAL DEVICE, METHOD OF MANUFACTURING THE SAME, AND ELECTRONIC APPARATUS

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/657,141

(22) Filed: Sep. 9, 2003

(65) Prior Publication Data
US 2004/0119075 A1 Jun. 24, 2004

(30) Foreign Application Priority Data
Sep. 30, 2002 (JP) .............................. 2002-286145

(51) Int. Cl.
*G02F 1/1345* (2006.01)
(52) U.S. Cl. ..................... 345/100; 345/98; 349/38; 349/40; 349/149
(58) Field of Classification Search .............. 257/72, 257/59; 349/38, 149, 40; 345/98, 100, 55
See application file for complete search history.

(56) References Cited

U.S. PATENT DOCUMENTS

| 6,100,865 | A | * | 8/2000 | Sasaki | ........................ | 345/92 |
|---|---|---|---|---|---|---|
| 6,404,414 | B1 | * | 6/2002 | Ishii | .............................. | 345/90 |
| 6,847,344 | B1 | | 1/2005 | Ha | | |
| 2001/0022572 | A1 | * | 9/2001 | Murade | ........................ | 345/98 |
| 2002/0047820 | A1 | | 4/2002 | Ha | | |
| 2002/0154252 | A1 | * | 10/2002 | Toyota et al. | .................. | 349/38 |

FOREIGN PATENT DOCUMENTS

| CN | 1220740 A | 6/1999 |
|---|---|---|
| JP | A-03-002731 | 1/1991 |
| JP | A-05-005866 | 1/1993 |
| JP | A-07-028090 | 1/1995 |
| JP | A 11-223832 | 8/1999 |
| JP | A-2001-352072 | 12/2001 |
| KR | 2002-0017434 | 3/2002 |

* cited by examiner

*Primary Examiner*—Kenneth Parker
*Assistant Examiner*—Matthew C. Landau
(74) *Attorney, Agent, or Firm*—Oliff & Berridge PLC

(57) ABSTRACT

The present invention provides an electro-optical device including, on a substrate, data lines extending in a predetermined direction, scanning lines extending orthogonal to the data lines, pixel electrodes and pixel switching elements arranged at intersections of the scanning lines and the data lines, and capacitors including, as first electrodes, conductive layers connected to or extending from the data lines.

12 Claims, 15 Drawing Sheets

ELECTRO-OPTICAL DEVICE, METHOD OF MANUFACTURING THE SAME, AND ELECTRONIC APPARATUS

BACKGROUND OF THE INVENTION

1. Field of Invention

The present invention relates to an electro-optical device, such as a liquid crystal device, an EL (electro luminescence) device, and an electron emission device (a field emission display device and a surface-conduction electron-emitter display device), for example, a method of manufacturing the same, and an electronic apparatus. The present invention also relates to an electrophoresis device, such as an electronic paper.

2. Description of Related Art

A related art electro-optical device, such as a liquid crystal device, includes, for example, pixel electrodes arranged in a matrix, thin film transistors (hereinafter, sometimes referred to as "TFTs") connected to the respective pixel electrodes, and scanning lines and data lines connected to the respective TFTs and arranged to be parallel to each other in a row direction and in a column direction, in which the scanning lines are driven by a scanning line driving circuit and the data lines are driven by a data line driving circuit, thereby performing a so-called active matrix driving.

The active matrix driving is a driving method of controlling the operation of switching elements, such as the TFTs by supplying scanning signals to the scanning lines and of applying electric fields corresponding to image signals to the pixel electrodes in turn corresponding to the switching elements such as the TFTs turned on by the scanning signals by supplying the image signals to the data lines.

Various methods of supplying the image signals have been proposed including a method of supplying image signals to each data line in order and a method of simultaneously supplying image signals to each group of several adjacent data lines after serial-to-parallel conversion of the image signals.

SUMMARY OF THE INVENTION

Supply of image signals through data lines according to a conventional technology has the following problems. When the method of simultaneously supplying image signals to each group is taken as an example among the above-mentioned methods of supplying image signals, display unevenness occurs on an image along the data lines arranged in a region corresponding to the boundary between a group to which the image signals are actually supplied (hereinafter "a supplied group") and a group adjacent to the supplied group (hereinafter "an unsupplied group").

This phenomenon occurs because electric fields correctly corresponding to the image signals are not applied to the pixel electrodes that exist on the boundary between the supplied group and the unsupplied group. To be more specific, when capacitance around the data lines (for example, the wiring line capacitance of the data lines or capacitance generated by overlapping the data lines with other wiring lines and counter electrodes) is significantly small, the pushdown amount of image signal electric potential recorded in the data lines increases due to the influence of the parasitic capacitance between the gates and the drains of the TFTs that form a sampling circuit, so that a change in the electric potential in the data lines increases. Thus, a change in the electric potential is caused in the pixel electrodes arranged to correspond to the data lines. As a result, the display unevenness occurs along the data lines.

This problem is more difficult to address or solve when common requirements such as miniaturization and high precision of an electro-optical device are premised. This is because in order to realize the miniaturization and the high precision, various components that construct the electro-optical device, such as the above-mentioned scanning lines, data lines, TFTs, and pixel electrodes, must be reduced in size or width. However, when the data lines are narrowed, the capacitance applied to the data lines is further reduced, and thus the change in the electric potential of the data lines increases, thereby resulting in a significant increase of the display unevenness along the data lines.

The present invention addresses the above and/or other problems, and provides an electro-optical device capable of displaying a high-quality image without display unevenness along the data lines. The present invention also provides an electro-optical device with a structure capable of displaying a high-quality image without the above-mentioned display unevenness while realizing the miniaturization and the high precision of the electro-optical device. The present invention also provides a method of manufacturing the electro-optical device and an electronic apparatus including the electro-optical device.

In order to address or solve the above, an electro-optical device according to the present invention includes, on a substrate, data lines extended in a predetermined direction, scanning lines extended so as to be orthogonal to the data lines, pixel electrodes and pixel switching elements arranged at intersections of the scanning lines and the data lines, and capacitors including, as first electrodes, conductive layers connected to or extending from the data lines.

According to the electro-optical device of the present invention, it is possible to apply voltages, in accordance with the image signals, to the pixel electrodes through the TFTs, by controlling the switching operation of the TFTs, an example of the pixel switching elements, through the scanning lines and by supplying the image signals through the data lines.

In particular, the present invention provides capacitors including, as first electrodes, conductive layers connected to or extending from the data lines. For example, although a capacitor is generally supposed to include a pair of electrodes and an insulating film interposed between the pair of electrodes, in the invention the conductive layers connected to or extending from the data lines correspond to the first electrodes that form the pair of electrodes, and other conductive layers arranged to face the conductive layers correspond to the other electrodes. Therefore, it is possible to secure the capacitance around the data lines by adding the capacitor to the wiring line capacitance of the data lines or the capacitance generated by overlapping the data lines with other wiring lines and a counter electrode. As a result, it is possible to reduce or prevent the occurrence of the change in the electric potential to be held by the data lines and thereby to reduce or prevent the occurrence of the change in the electric potential of the pixel electrodes in accordance with the above change.

Thus, according to the present invention, it is possible to reduce or prevent the occurrence of the display unevenness along the data lines, which is described above with regard to the related art, and to display a high-quality image.

Furthermore, it is possible to obtain the above regardless of the miniaturization and the high precision of the electro-optical device. For example, even if the data lines are narrowed due to the miniaturization of the electro-optical device, it is possible to separately include the "capacitor" according to the present invention. That is, if the data lines are narrowed, it is possible to appropriately secure the capacitance around the data lines as long as the "capacitors" for compensating for the narrowed data lines are included. As mentioned above, according to the present invention, it is possible to realize the miniaturization and the high precision of the electro-optical device and to display the excellent-quality image without the display unevenness.

According to the present invention, when the expression "the conductive layers are connected to the data lines" is used, the conductive layer may be connected to the data lines through various means, in addition to bypass layers as mentioned hereinafter. The term "be connected" herein can be understood, for example, as the connection through contact holes.

When the expression "conductive layers extending from data lines" is used, the conductive layers may be formed in the same layer as the data lines but are formed of a material different from that of the data lines. Also, the data lines may be extended to form the conductive layers (that is, the conductive layers are made of the same material as that of the data lines and are not clearly distinguished from the data lines). In the latter case, the entirety or part of the data lines may form the electrodes of the "capacitors".

An aspect of the electro-optical device according to the present invention may include capacitor electrode wiring lines extending in a direction orthogonal to the data lines, and second electrodes forming the capacitors including other conductive layers connected to the capacitor electrode wiring lines or extending from the capacitor electrode wiring lines.

According to this aspect, since the electro-optical device includes capacitor electrode wiring lines extending in a direction orthogonal to the data lines and the other electrodes of the capacitors include other conductive layers connected to or extending from the capacitor electrode wiring lines, it is possible to form capacitors whose fabrication and structure are relatively simple and whose reliability is high.

This is because at least one electric connection point, between a part of the capacitor electrode wiring line and an electric source for supplying the electric potential, is enough to supply the necessary electric potential (for example, a predetermined "fixed potential" as described later), to the capacitor electrode wiring line. In this regard, when individual capacitor electrodes are provided corresponding to the respective data lines, it is necessary to individually supply the electric potential and to form a plurality of electric connection points. In such a case, manufacturing yield deteriorates (for example, a capacitor for a certain data line normally operates and a capacitor for another data line does not operate). The property of each capacitor varies and reliability entirely deteriorates. According to the present aspect, it is possible to prevent the occurrence of such phenomena.

According to another aspect of the electro-optical device of the present invention, the capacitor electrode wiring lines may have a fixed potential.

According to this aspect, because the capacitor electrode wiring line, i.e., the other electrode that forms a capacitor, has a fixed potential, the other conductive layer also has a fixed potential and the capacitor can appropriately function. For example, in the capacitor, it is possible to accumulate an appropriate amount of electric charge in accordance with an electric potential difference between a voltage in accordance with the image signals supplied to the data lines and its fixed potential.

According to this aspect, the electro-optical device may include a counter substrate facing the substrate, a counter electrode formed on the counter substrate and arranged to face the pixel electrodes, a driving circuit, arranged on either the counter substrate or the substrate, for driving the scanning lines, the data lines, and the pixel electrodes, a first power source for supplying a fixed potential to the counter electrode, and a second power source for supplying a fixed potential to the driving circuit. The capacitor electrode wiring lines are connected to the first power source or the second power source to have a fixed potential.

According to this structure, a power source for making the capacitor electrode wiring line connected to the other conductive layer, for example, the other electrode of the capacitor, have a fixed potential and, a power source (a first power source) for making the counter electrode have a fixed potential, or a power source (a second power source) for supplying a fixed potential to be supplied to a driving circuit are shared, it is possible to simplify the structure of the electro-optical device.

According to the present aspect, the first power source and the second power source may be one common power source.

According to another aspect of the electro-optical device of the present invention, the capacitor electrode wiring lines are made of a low resistance material.

According to this aspect, wiring delay does not matter because the capacitor electrode wiring lines are made of the low resistance material. The low resistance material according to the present aspect is, for example, aluminum.

According to another aspect of the electro-optical device of the present invention, the electro-optical device may include a data line driving circuit for driving the data lines at one end of the data lines, and the capacitors are provided at the other end of the data lines.

According to this aspect, the arrangement of various components with respect to the data lines becomes appropriate. According to the present aspect, since the data line driving circuit is arranged at one end of the data line and the capacitor is arranged at the other end of the data line, the image signal flows through the data line driving circuit, the data lines (including the pixel switching elements and the pixel electrodes connected to the data lines), and the capacitor in that order. Therefore, the image signals are smoothly transmitted to the pixel electrodes. Also, the electric charges are accumulated on the capacitor by the used image signals. For example, according to the present aspect, although the capacitor may serve as an obstacle to the data lines, it is possible to effectively reduce or prevent the data lines from being affected by the capacitor.

Also, according to the present aspect, a sampling circuit may be provided between the data line driving circuit and the data lines.

According to another aspect of the present invention, the electro-optical device may include a data line driving circuit for driving the data lines at one end of the data lines, and a test circuit for checking the operation of the electro-optical device at another end of the data lines.

According to this aspect, it is possible to check the operation of the electro-optical device, in particular, the operation of the TFT as the pixel switching element by the test circuit. According to this aspect, it is also possible to appropriately layout various components on the substrate by providing the test circuit at the other end of the data line.

According to an aspect obtained by adding the above, in which the capacitor is provided at the other end of the data line, to the present aspect, the layout of various components can be appropriately determined.

According to another aspect of the electro-optical device of the present invention, the electro-optical device may include storage capacitors connected to the pixel electrodes and the pixel switching elements, and at least some of the members forming the capacitors can be formed in the same step as at least some of the members forming the storage capacitors in the manufacturing process.

According to this aspect, it is possible to improve a potential maintaining property in the pixel electrodes because the storage capacitors connected to the pixel electrodes and the pixel switching elements are included. Therefore, it is possible to display a high-quality image with a property such as high contrast.

According to the present aspect, for example, at least some of the members that form the capacitor can be formed in the same step as at least some of the members that form the storage capacitor in the manufacturing process. This will be described in more detail as follows.

The storage capacitor includes pixel-potential-side capacitor electrodes connected to the pixel switching elements and the pixel electrodes, capacitor electrodes arranged to face the pixel-potential-side capacitor electrodes and to have a fixed potential, and an insulating film interposed between the pair of electrodes. The "capacitors" according to an aspect of the present invention include conductive layers connected to the data lines and extending from the data lines as first electrodes, other conductive layers connected to the capacitor electrode wiring lines or extending from the capacitor electrode wiring lines as second electrodes, and an insulating film interposed between the pair of electrodes. In this case, the "members that construct the storage capacitor" are the pixel-potential-side capacitor electrodes, the capacitor electrodes, and the insulating films. The "members that construct the capacitor" are the data lines, the capacitor electrode wiring lines, and the insulating films.

When the members that form the storage capacitor are formed in the same step as at least some of the members that form the capacitor in the manufacturing process, the conductive layers and the pixel-potential-side capacitor electrodes are made of the same film, the other conductive layers and the fixed-potential-side capacitor electrodes are made of the same film, or the insulating film of the "capacitors" and the insulating film of the "storage capacitors" are made of the same film. Also, to be formed of the same film means that, for example, the conductive layers and the fixed-potential-side capacitor electrodes are formed to be suitable for the respective places and to have unique patterns by forming a common precursor film in the capacitors and the storage capacitors and patterning the capacitors and the storage capacitors.

As mentioned above, according to the present aspect, it is possible to simplify manufacturing steps and to reduce manufacturing costs by manufacturing the capacitors and the storage capacitors in the same step, compared to a case where both components (i.e., the capacitors and the storage capacitors) are separately manufactured. Further, according to the structure related to the present aspect, it is possible for the capacitors to have smaller area.

According to an aspect with the above-mentioned capacitor electrode wiring lines, the capacitor electrode wiring lines and the data lines are preferably formed in the same step in the manufacturing process.

According to the above structure, because the capacitor electrode wiring lines and the data lines are formed of the same film, it is possible to simplify the manufacturing steps and to reduce the manufacturing costs compared to where the capacitor electrode wiring lines and the data lines are separately manufactured.

According to an aspect in which the capacitor and the storage capacitor are formed in the same step, the above effects are achieved more effectively.

According to an aspect, in which the capacitors or components related to the capacitors and components in an image display region, such as the storage capacitors and the data lines are formed in the same step, the electro-optical device may include bypass layers connected to the data lines and the conductive layers, and the bypass layers may be formed in the same step as the scanning lines in the manufacturing process.

According to such a structure, the data lines and the conductive layers are connected to each other through bypass layers. That is, the data lines and the conductive layers can be formed as separate members and can be made of different materials. For example, it is possible that the data lines are made of aluminum and the conductive layers are made of polysilicon. On the other hand, a material, forming at least one of the pair of electrodes that construct the storage capacitor, is generally selected based on a criteria such as performance as the storage capacitor. For example, because at least one of the pair of electrodes functions as an upper light shielding film for preventing light from being incident on the pixel switching TFTs, the electrode is formed of polysilicon with an excellent optical absorption property.

An aspect of forming at least one, of the pair of electrodes that form the storage capacitor and the conductive layers in the same step, is easier than where a part of the data line form the electrodes of the capacitor. That is, when the "bypass layers" according to this structure are provided, it is easier to manufacture the aspect, in which the capacitor and at least some of the storage capacitors and capacitors are formed in the same step, of the manufacturing steps.

According to an aspect of the present invention, in particular, the bypass layer and the scanning lines are formed in the same step in the manufacturing process. Therefore, according to the present structure, it is possible to more effectively simplify the manufacturing steps and to reduce the manufacturing costs.

Also, according to the present aspect, the scanning lines may include gate electrodes that form the TFTs as the pixel switching elements.

According to this aspect, the electro-optical device may include a data line driving circuit for driving the data lines at one end of the data lines, and a test circuit for checking the operation of the capacitors and the corresponding electro-optical device at the other end of the data lines. The test circuit may be connected to the data lines through the bypass layers.

According to such a structure, it is possible to determine the layout of the data lines, the capacitors, and wiring lines for connecting the data lines to the test circuit. For example, providing the capacitors on the bypass layers with interlayer insulating films interposed therebetween, forming the data lines and the test circuit and wiring lines extending from the data lines and the test circuit on the capacitors or as the same layer as the capacitor, and forming contact holes for connecting the bypass layer to the data lines and for connecting the bypass layers to the wiring lines between the bypass layers and the data lines and the bypass layers and the wiring lines. In this case, it is possible to realize the layout of various components. In particular, the capacitor does not occupy large area.

According to another aspect of the electro-optical device, a portion to be the first electrodes of the conductive layers is wider than the data lines.

According to this aspect, it is possible to increase the capacitance value of the capacitor. Therefore, according to the present aspect, it is possible to more easily secure the capacitance around the data lines and to reduce a possibility of causing the change in the electric potential of the pixel electrodes much clearly than described above. As a result, it is possible to display a high-quality image.

In order to increase the above-mentioned effects, it is naturally assumed that a portion that serves as the other electrode of the other conductive layer is formed wider than the data line, in addition to the above aspect.

According to another aspect of the electro-optical device, the plurality of the data lines are divided into a plurality of groups, to which image signals are simultaneously supplied.

According to this aspect, it is possible to simultaneously supply a plurality of image signals resulting from the serial to parallel conversion of an image signal to the data lines. Therefore, it is possible to effectively transmit the image signals. However, in this case, the display unevenness, in images in accordance with the corresponding data lines, is apt to occur for the data lines in both ends of a "group" of data lines, to which the image signals are simultaneously supplied. Because the display unevenness occurs in the units of groups, it is more recognizable. That is, the deterioration of the quality of images is visible. Also, in this case, display unevenness may occur because, adjacent to the data lines, which are provided at the ends of the group to which the image signals are supplied, there exist data lines to which the image signals are not supplied. The relationship between the data lines and the pixel electrodes is apt to cause display unevenness.

According to an aspect of the present invention, because the capacitors are provided to the data lines as mentioned above, it does not matter even if the image signals are supplied as mentioned above. For example, the capacitors according to the present aspect play a more important role in the case where the image signals are supplied as mentioned above, than where the image signals are supplied in another manner.

Also, "the group of the data lines, to which the image signals are simultaneously supplied", is determined by how many parallel signals form the corresponding image signal. For example, when it is assumed that the image signal is obtained by serial-to-parallel conversion of a serial signal into six parallel signals, the "group" of the data lines consists of six data lines adjacent to each other.

In order to reduce or solve the above problems, the present invention provides a method of manufacturing an electro-optical device which includes on a substrate, data lines extended in a predetermined direction, scanning lines extended so as to be orthogonal to the data lines, pixel electrodes and thin film transistors arranged at intersections of the scanning lines and the data lines, storage capacitors connected to the pixel electrodes and the thin film transistors, and capacitors connected to the data lines or extending from the data lines, the method including a simultaneous manufacturing step of forming at least some of the members forming the capacitors and at least some of the members forming the storage capacitors as the same film.

According to the method of manufacturing the electro-optical device, it is possible to easily form the electro-optical device according to the present invention. According to the present invention, it is possible to simplify the manufacturing steps and to reduce the manufacturing costs, because the method includes the simultaneous manufacturing step of forming at least some of the members which form the capacitors and at least some of the members that form the storage capacitors as the same film.

According to an aspect of the method of manufacturing the electro-optical device, the storage capacitors include pixel-potential-side capacitor electrodes connected to the pixel electrodes and the thin film transistors, fixed-potential-side capacitor electrodes arranged to face the pixel-potential-side capacitor electrodes, and first insulating films interposed between both electrodes. The capacitors include conductive layers connected to the data lines or extending from the data lines, other conductive layers arranged to face the conductive layers, and second insulating films interposed between both layers. The simultaneous manufacturing step includes at least one step of the steps of forming the pixel-potential-side capacitor electrodes and the conductive layers as the same film, forming the fixed-potential-side capacitor electrodes and the other conductive layers as the same film, and forming the first insulating films and the second insulating films as the same film.

According to this aspect, the simultaneous manufacturing step includes forming at least one of the following groups as the same film: the pixel-potential-side capacitor electrodes and the conductive layers, the fixed-potential-side capacitor electrodes and the other conductive layers, and the first insulating layers and the second insulating layers. Therefore, it is possible to simplify the manufacturing steps and to reduce the manufacturing costs.

According to another aspect of the method of manufacturing the electro-optical device, the method includes, before the simultaneous manufacturing step, a step of forming gate electrodes and bypass layers forming the thin film transistors as the same film; a step of forming contact holes for connecting the bypass layers to the data lines; and a step of forming contact holes for connecting the bypass layers to the conductive layers.

According to this aspect, it is possible to comparatively easily manufacture the electro-optical device with the bypass layers among various aspects of the above-mentioned electro-optical device according to the present invention, because the bypass layers are formed before the simultaneous manufacturing step and the bypass layers are electrically connected to the data lines and the conductive layers. According to the present aspect, it is possible to simplify the manufacturing steps or to reduce the manufacturing costs, because the gate electrodes and the bypass layers that construct the TFTs are formed of the same film.

Also, according to the present aspect, the scanning lines and the gate electrodes may be simultaneously formed so as to include the gate electrodes.

Further, in the present aspect, the gate electrodes and the bypass layers are formed below the storage capacitor and the capacitor because the gate electrodes and the bypass layers are formed before the simultaneous manufacturing step.

According to another aspect of the method of manufacturing the electro-optical device according to the present invention, the method includes, after the simultaneous manufacturing step, a step of forming the data lines, forming capacitor electrode wiring lines extending in a direction orthogonal to the data lines of the same film, and a step of forming contact holes for connecting the capacitor electrode wiring lines to the other conductive layers.

According to this aspect, it is possible to comparatively easily manufacture the electro-optical device with the capacitor electrode wiring lines among various aspects of the electro-optical device according to the present invention, because the capacitor electrode wiring lines are formed and the capacitor electrode wiring lines are electrically connected to the other conductive layers. According to the present aspect, in particular, it is possible to simplify the manufacturing steps and to reduce the manufacturing costs, because the capacitor electrode wiring lines and the data lines are formed as the same film.

Further, in the present aspect, the data lines and the capacitor electrode wiring lines are formed on the storage capacitors and the capacitors, because the data lines and the capacitor electrode wiring lines are formed after the simultaneous manufacturing step.

According to this aspect, in particular, the corresponding electro-optical device may include a test circuit. The method may include the steps of forming wiring lines connected to the test circuit, the data lines, and the capacitor electrode wiring lines as the same film, and forming contact holes for connecting the wiring lines to the bypass layers.

According to this structure, it is possible to simplify the manufacturing steps or to reduce the manufacturing costs, because the wiring lines connected to the test circuit, the data lines, and the capacitor electrode wiring lines are formed as the same film. Also, according to this structure, the bypass layer plays an important role in connecting the data lines to the wiring lines. Also, it is possible to realize the layout of various components that form the electro-optical device manufactured by the manufacturing method according to the present aspect.

The electronic apparatus according to the present invention includes the electro-optical device (including other various aspects thereof) in order to reduce or solve the above problems.

Since the electronic apparatus according to the present invention include the above-mentioned electro-optical device, the capacitors are provided in the data lines. Therefore, it is possible to realize various electronic apparatuses, such as projection type display devices (liquid crystal projectors), liquid crystal TV sets, mobile telephones, electronic organizers, word processors, view finder type or monitor direct view type video tape recorders, work stations, picture telephones, POS terminals, and touch panels, which are capable of displaying excellent-quality images and in which the display unevenness along the data lines does not occur.

Such operations and other advantages according to the present invention will be apparent from the following detailed description of the exemplary embodiments.

DETAILED DESCRIPTION OF PREFERRED EMBODIMENTS

Hereinafter, an exemplary embodiment of the present invention is described below with reference to the attached drawings. According to the exemplary embodiment, an electro-optical device according to the present invention is applied to liquid crystal devices.

Figure 1:
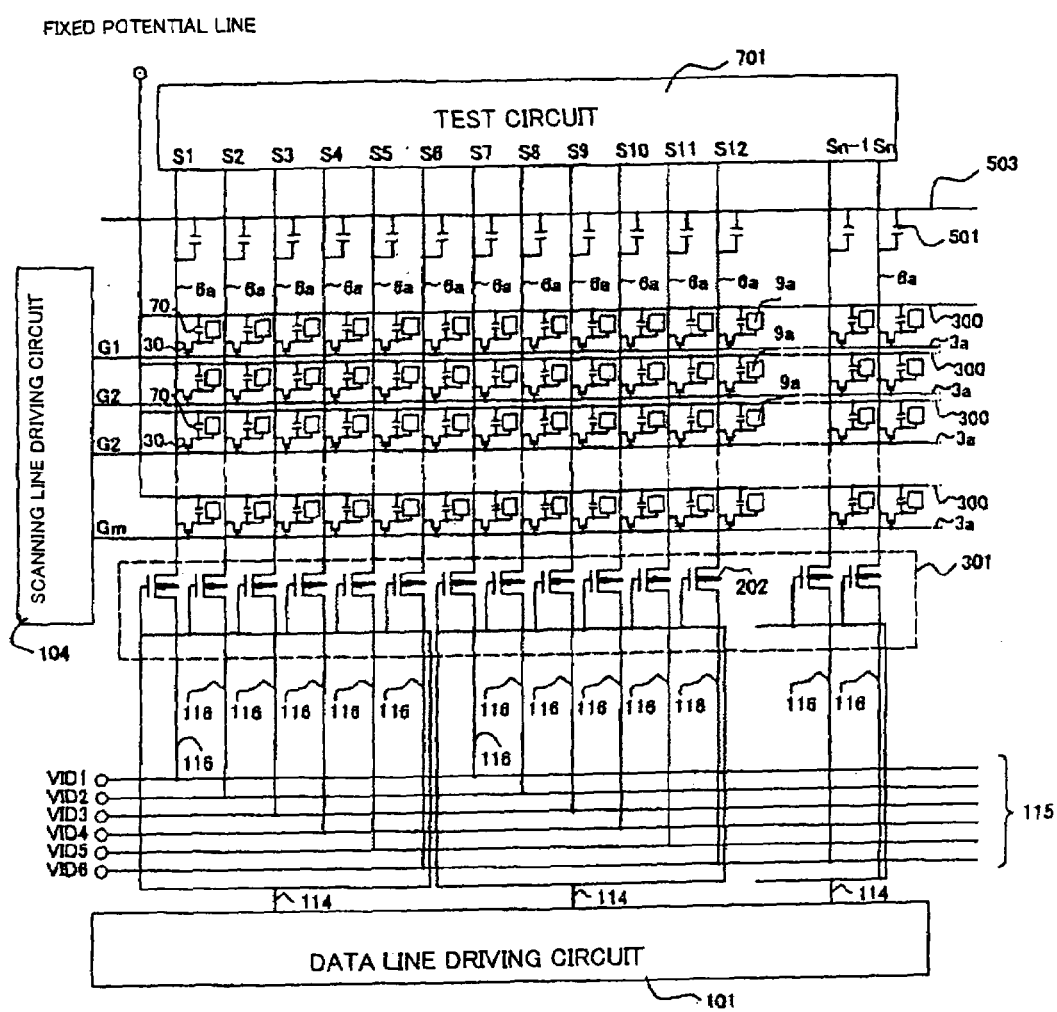
FIG. 1 is a schematic circuit diagram illustrating various elements and wiring lines provided in a plurality of pixels which are arranged in a matrix and form an image display region in an electro-optical device according to an exemplary embodiment of the present invention.
Figure 2:
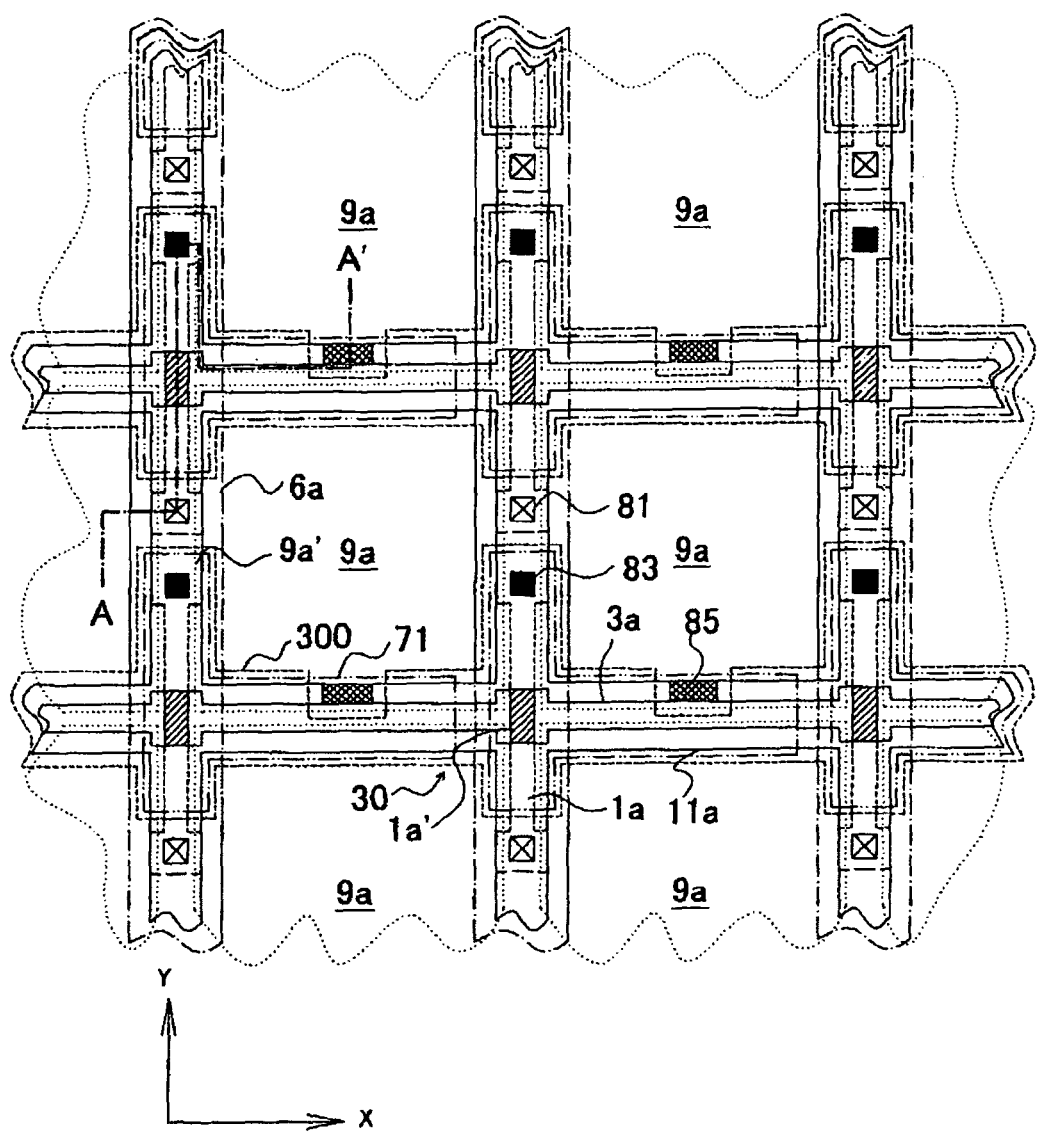
FIG. 2 is a plan view of a plurality of pixel groups adjacent to each other on a TFT array substrate, in which data lines, scanning lines, and pixel electrodes are formed, in the electro-optical device according to an exemplary embodiment of the present invention.
Figure 3:
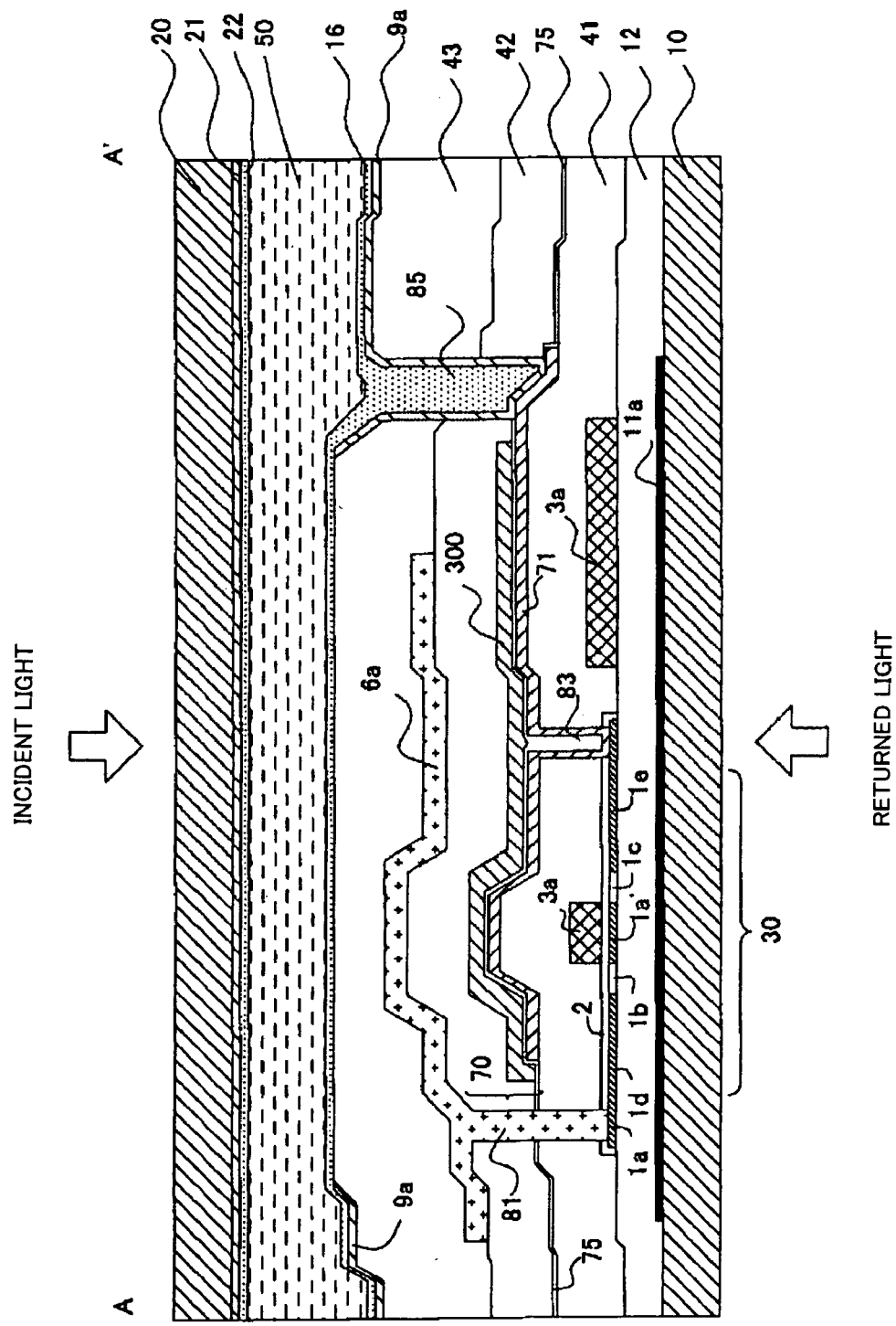
FIG. 3 is a sectional view taken along plane A–A' of FIG. 2.

The structure of a pixel portion of an electro-optical device according to the exemplary embodiment of the present invention is described below with reference to FIGS. 1 to 3. FIG. 1 illustrates an equivalent circuit of various elements and wiring lines provided in a plurality of pixels which are arranged in a matrix and form an image display region of the electro-optical device. FIG. 2 is a plan view of a plurality of pixel groups adjacent to each other on the TFT array substrate, in which the data lines, the scanning lines, and the pixel electrodes are formed. FIG. 3 is a sectional view taken along the plane A–A' of FIG. 2. In FIG. 3, respective layers and members are shown in different scales to make them recognizable in the drawing.

In FIG. 1, pixel electrodes 9a and TFTs 30 for switching controlling the corresponding pixel electrodes 9a are formed in a plurality of pixels which are arranged in a matrix, and form an image display region of an electro-optical device according to the present exemplary embodiment. Data lines 6a, to which image signals are supplied, are electrically connected to sources of the corresponding TFTs 30. Image signals S1, S2, . . . , and Sn recorded in the data lines 6a, may be line sequentially supplied in this order. However, according to the present exemplary embodiment, in particular, the image signals S1, S2, . . . , and Sn are subjected to serial-to-parallel conversion to form N parallel image signals and are supplied from N image signal lines 115 to each group of N data lines 6a adjacent to each other.

One end of each of the data lines 6a (the lower end of FIG. 1) is connected to switching circuit elements 202, which form a sampling circuit 301, in a peripheral region outside the image display region. Either n channel TFTs or p channel TFTs may be used as the switching circuit elements as illustrated in FIG. 1. Also, a complementary TFT may be used as the switching circuit element (hereinafter, the switching circuit elements 202 illustrated in FIG. 1 are referred to as the TFTs 202). In this case, the lower end of the data lines 6a of FIG. 1 is connected to the drains of the TFTs 202 through lead-out wiring lines 206. Image signal lines 115 are connected to the sources of the TFTs 202 through lead-out wiring lines 116. Sampling circuit driving signal lines 114 connected to a data line driving circuit 101 are connected to the gates of the TFTs 202. The image signals S1, S2, . . . , and Sn on the image signal lines 115 are sampled by the sampling circuit 301 in response to the supply of the sampling signals from the data line driving circuit 101 through the sampling circuit driving signal lines 114 and are supplied to the data lines 6a.

The image signals S1, S2, . . . , and Sn recorded in the data lines 6a may be line sequentially supplied in this order, or may be supplied to each group of the plurality of data lines 6a adjacent to each other. According to the present exemplary embodiment, as illustrated in FIG. 1, the image signals are simultaneously supplied to a group of six data lines 6a.

According to the present exemplary embodiment, capacitor 501 is provided at the other end (the upper end of FIG. 1) of each of the data lines 6a as illustrated in FIG. 1. In the capacitors 501, conductive layers (referring to first conductive layers 511 to be described later) connected to the data lines 6a, or extending from the data lines 6a, are used as first electrodes. Other conductive layers, (refer to second conductive layers 512 to be described later) connected to or extending from, a capacitor electrode wiring line 503, which extends to be orthogonal to the data lines 6a and is held at a fixed potential, are used as another electrodes. An insulating film is interposed between the first electrodes and the other electrodes. When the image signals S1, S2, . . . , and Sn are supplied to the data lines 6a, electric charges in accordance with a difference between electric potentials corresponding to the image signals and the fixed potential of the capacitor electrode wiring line 503 are accumulated in the capacitors 501. Therefore, it is possible to secure the capacitance around the data lines 6a and to reduce or prevent an unstable change in a voltage of the data lines 6a and change in the electric potential of the pixel electrodes 9a. As a result, it is possible to reduce or prevent the occurrence of the display unevenness on images along the data lines 6a. More specific structure of these capacitors 501 will be described later.

Since the scanning lines 3a are electrically connected to the gates of the TFTs 30, scanning signals G1, G2, . . . , and Gm are line sequentially applied as pulses to the scanning lines 3a in this order at a predetermined timing. Since the pixel electrodes 9a are electrically connected to the drains of the TFTs 30, the image signals S1, S2, . . . , and Sn supplied from the data lines 6a are recorded at a predetermined timing by turning off the switches of the TFTs 30 which are switching elements, for a predetermined period.

The image signals S1, S2, . . . , and Sn of a predetermined level, which are recorded in liquid crystal through the pixel electrodes 9a, are held between the pixel electrodes 9a and counter electrodes formed on a counter substrate, for a predetermined period. The liquid crystal is an example of an electro-optical material. The liquid crystal can perform light modulation and gray scale display by changing the alignment or the order of molecular association depending on an applied voltage level. In a normally-white mode, a transmittance rate for incident light is reduced in accordance with a voltage applied to pixel units. In a normally-black mode, the transmittance rate for the incident light increases in accordance with the voltage applied to pixel units. Therefore, as a whole, light having a contrast in accordance with an image signal is emitted from the electro-optical device.

In order to reduce or prevent leakage of the held image signal, storage capacitors 70 are added parallel to liquid crystal capacitors formed between the pixel electrodes 9a and the counter electrodes. The storage capacitors 70 are provided parallel to the scanning lines 3a, including fixed-potential-side capacitor electrodes and capacitive lines 300 fixed at a constant potential.

The specific structure of the electro-optical device, in which the above-mentioned circuit operation is realized by the data lines 6a, the scanning lines 3a, the TFTs 30 and the like, will now be described with reference to FIGS. 2 and 3.

The electro-optical device according to the present exemplary embodiment, includes a transparent TFT array substrate 10 and a transparent counter substrate 20 arranged to face each other as illustrated in FIG. 3, a sectional view taken along the plane A–A' of FIG. 2. The TFT array substrate 10 is formed of, for example, a quartz substrate, a glass substrate, or a silicon substrate. The counter substrate 20 is formed of, for example, a glass substrate or a quartz substrate.

As illustrated in FIG. 3, the pixel electrodes 9a are provided on the TFT array substrate 10. An alignment film 16 is formed on the pixel electrodes 9a. A predetermined alignment process such as rubbing process is performed to the alignment film 16. The pixel electrodes 9a are formed of a transparent conductive film, such as an indium tin oxide (ITO) film. The counter electrode 21 is provided on the entire surface of the counter substrate 20. An alignment film 22, on which a predetermined alignment process, such as rubbing process, is performed, is provided below the counter electrode 21. The counter electrode 21 is formed of a transparent conductive film, such as an ITO film similarly to the pixel electrodes 9a. The alignment films 16 and 22 are formed of, for example, a transparent organic film, such as a polyimide film. An electro-optical material, such as liquid crystal, is injected into a space surrounded by a sealing material, to be described later, (refer to FIGS. 14 and 15) between the TFT array substrate 10 and the counter substrate 20 facing each other, thereby to form a liquid crystal layer 50. The liquid crystal layer 50 has a certain alignment, determined by the alignment films 16 and 22, when no electric field is applied to it from the pixel electrodes 9a. The liquid crystal layer 50 is formed of, for example, an electro-optical material formed of one nematic liquid crystal or a mixture of various kinds of nematic liquid crystals. The sealing material is an adhesive agent formed of, for example, photo-curing resin or thermosetting resin for bonding the TFT substrate 10 and the counter substrate 20 at their peripheries. Spacers, such as glass fibers or glass beads, for separating the substrates from each other by a predetermined distance, are mixed with the adhesive agent.

In FIG. 2, the plurality of pixel electrodes 9a are formed in a matrix on the TFT array substrate 10 (the outlines are shown by the dotted line portions 9a'). The data lines 6a and the scanning lines 3a are provided along the horizontal and vertical boundaries of the pixel electrodes 9a. The data lines 6a are made of, for example, a metal film such as an aluminum film or an alloy film. The scanning lines 3a are made of, for example, a conductive polysilicon film. The scanning lines 3a are arranged to face the channel regions 1a', which are marked by the forward slanting lines in the drawing in the semiconductor layer 1a. The scanning lines 3a function as gate electrodes. For example, the pixel switching TFTs 30, in which the main line portions of the scanning lines 3a as the gate electrodes face the channel regions 1a', are formed in the portions where the scanning lines 3a intersect the data lines 6a.

As illustrated in FIG. 3, the TFT 30 has, a LDD (lightly doped drain) structure and includes a scanning line 3a which functions as the gate electrode as mentioned above, the channel region 1a' of the semiconductor layer 1a, which is made of a polysilicon film, for example, and in which a channel is formed by an electric field from the scanning line 3a, an insulating film 2 including a gate insulating film for insulating the scanning line from the semiconductor layer 1a, and a lightly doped source region 1b, a lightly doped drain region 1c, a heavily doped source region 1d, and a heavily doped drain region 1e in the semiconductor layer 1a.

Although the TFT 30 preferably has an LDD structure as illustrated in FIG. 3, it may have an offset structure where a dopant is not implanted into the lightly doped source region 1b and the lightly doped drain region 1c. Also, the TFT 30 may be a self-aligned TFT, in which the dopant is implanted heavily using the gate electrode, a part of the scanning line 3a, as a mask, thereby to form the heavily doped source region and the heavily doped drain region by self-alignment. Furthermore, according to the present exemplary embodiment, only one gate electrode of the pixel switching TFT 30 is arranged between the heavily doped source region 1d and the heavily doped drain region 1e, which is referred to as a single gate structure. However, two or more gate electrodes may be arranged between the heavily doped source region 1d and the heavily doped drain region 1e. When the TFT consists of double gates, triple gates, or more, it is possible to reduce or prevent leakage of current in a connection portion between the channel and the source and drain regions and thereby to reduce the amount of current to be consumed when the TFT is turned off. Furthermore, the semiconductor layer 1a that forms the TFT 30 may be either a non-single crystal layer or a single crystal layer. A related art method, such as a connecting method may be used to form the single crystal layer. It is possible to improve the performance of peripheral circuits by forming the semiconductor layer 1a of the single crystal layer.

In FIG. 3, a storage capacitor 70 is formed, such that a relay layer 71 as the pixel-potential-side capacitor electrode connected to the heavily doped drain region 1e of the TFT 30 and the pixel electrode 9a, faces a part of the capacitive line 300 as the fixed-potential-side capacitor electrode interposing a dielectric film 75 therebetween. The storage capacitor 70 can improve the electric potential maintaining property of the pixel electrode 9a.

The relay layer 71 is made of, for example, a conductive polysilicon film and functions as the pixel-potential-side capacitor electrode. However, similarly to a capacitive line 300 to be mentioned later, the relay layer 71 may be formed of a single-layer film or a multi-layer film including a metal or an alloy. The relay layer 71 functions as the pixel-potential-side capacitor electrode and connects the pixel electrode 9a to the heavily doped drain region of the TFT 30 through contact holes 83 and 85.

The capacitive lines 300 are made of, for example, a conductive film including a metal or an alloy and function as the fixed-potential-side capacitor electrodes. The capacitive lines 300 overlap the scanning line 3a forming regions in plan view as illustrated in FIG. 2. The capacitive lines 300 include main line portions extending along the scanning lines 3a, protrusions that protrude upward along the data lines 6a from the intersections of the scanning lines 3a and the data lines 6a in the drawing, and slightly narrow portions which correspond to the contact holes 85. The protrusions contribute to enlarging the forming regions of the storage capacitors 70 using the regions above the scanning lines 3a and the regions below the data lines 6a. The capacitive lines 300 preferably extend from image display regions 10a, in which the pixel electrodes 9a are arranged, to their periphery regions and are electrically connected to a constant-potential source to have a fixed potential. Such a constant-potential source may be either of a plus power source or a minus power source supplied to the data line driving circuit 101 or a constant potential supplied to the counter electrode 21 of the counter substrate 20.

The dielectric film 75 is formed of a silicon oxide film or a silicon nitride film such as an HTO (high temperature oxide) film and an LTO (low temperature oxide) film that are relatively thin, whose thickness is about 5 to 200 nm, as shown in FIG. 3. In view of enlarging the storage capacitor 70, the dielectric film 75 is preferably thinner as far as reliability of the film is obtained.

In FIGS. 2 and 3, besides the above mentioned elements, a lower light shielding film 11a is formed below the TFT 30. The lower light shielding film 11a is patterned in a lattice, thereby to define the aperture region of each pixel. The aperture region is also defined by the data lines 6a and the capacitive lines 300 extended so as to be orthogonal to the data lines 6a in FIG. 2. The lower light shielding film 11a preferably extends from the image display regions to their periphery regions, thereby to be connected to the constant-potential source, in order to prevent the change in the electric potential of the lower light shielding film 11a from negatively influencing the TFT 30, as in the case of the capacitive lines 300.

A base insulating film 12 is formed below the TFT 30. The base insulating film 12, formed on the entire surface of the TFT array substrate 10, has a function of preventing the change in the properties of the pixel switching TFT 30 due to roughness caused by the abrasion of the surface of the TFT array substrate 10 and the contaminants remaining after cleansing, as well as a function of insulating the TFT 30 from the lower light shielding film 11a.

Furthermore, a first interlayer insulating film 41 having a contact hole 81 that leads to the heavily doped source region 1*d* and a contact hole 83 that leads to the heavily doped drain region 1*e* is formed on the scanning line 3*a*.

The relay layer 71 and the capacitive line 300 are formed on the first interlayer insulating film 41. A second interlayer insulating film 42 having the contact hole 81 that leads to the heavily doped source region 1*d* and the contact hole 85 that leads to the relay layer 71 is formed on the relay layer 71 and the capacitive line 300.

According to the present exemplary embodiment, ions implanted into the polysilicon film which forms the semiconductor layer 1*a* or the scanning line 3*a* may be activated by annealing the first interlayer insulating film 41 at a temperature of about 1,000° C. On the other hand, the stress generated around the interface of the capacitive line 300 may be relaxed by not annealing the second interlayer insulating film 42.

Furthermore, the data line 6*a* is formed on the second interlayer insulating film 42. A third interlayer insulating film 43 with the contact hole 85 that leads to the relay layer 71 is formed on the second interlayer insulating film 42 and the data line 6*a*.

The surface of the third interlayer insulating film 43 is flattened by CMP (chemical mechanical polishing) and the like, thereby to reduce disorder in the alignment of the liquid crystal layer 50 due to a step difference caused by various wiring lines or elements below the third interlayer insulating film 43.

Instead of or in addition to such flattening of the third interlayer insulating film 43, the flattening may be performed by burying the wiring lines, such as the data lines 6*a* or the TFTs 30 in a groove formed in at least one of the TFT array substrate 10, the base insulating film 12, the first interlayer insulating film 41, and the second interlayer insulating film 42.

Structure of Capacitor Formed in Data Line

Figure 4:
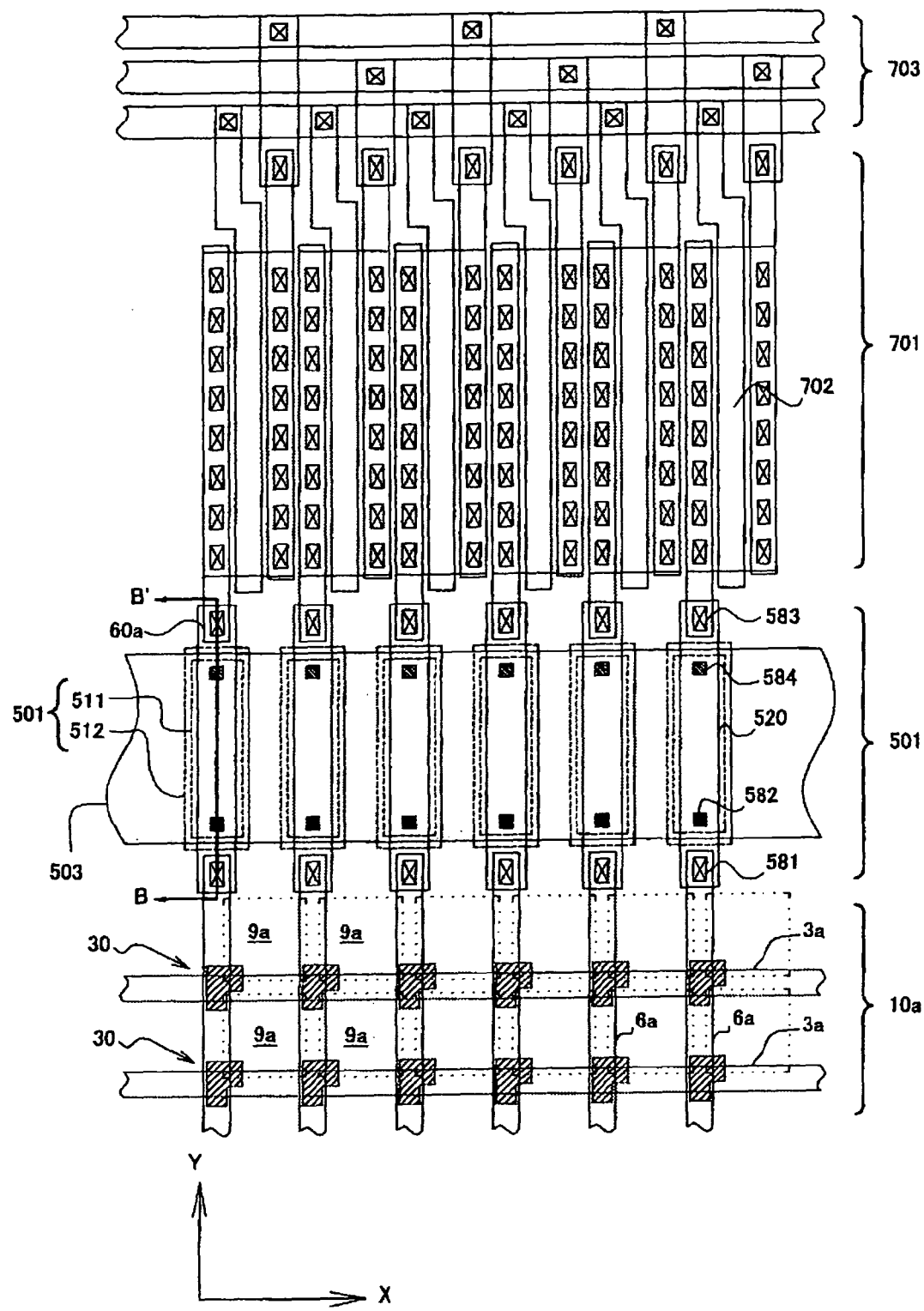
FIG. 4 is a plan view illustrating a state where a capacitor is formed in the electro-optical device according to an exemplary embodiment of the present invention.
Figure 5:
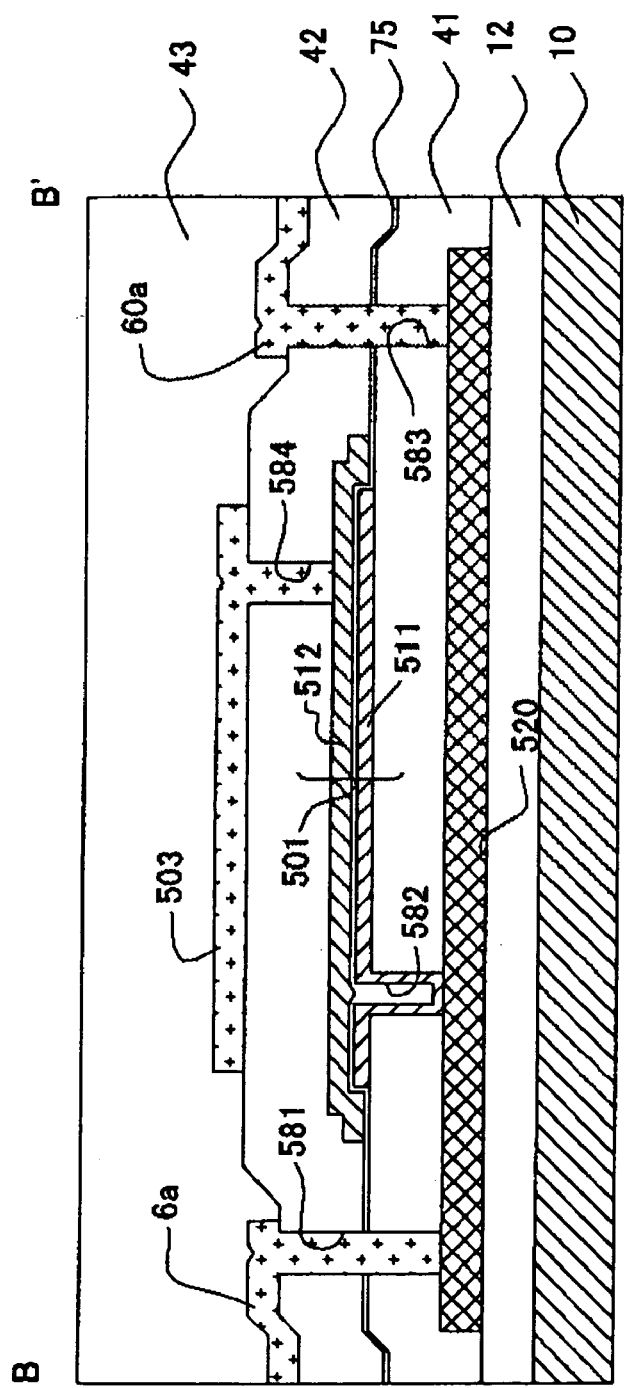
FIG. 5 is a sectional view taken along plane B–B' of FIG. 4.
Figure 6:
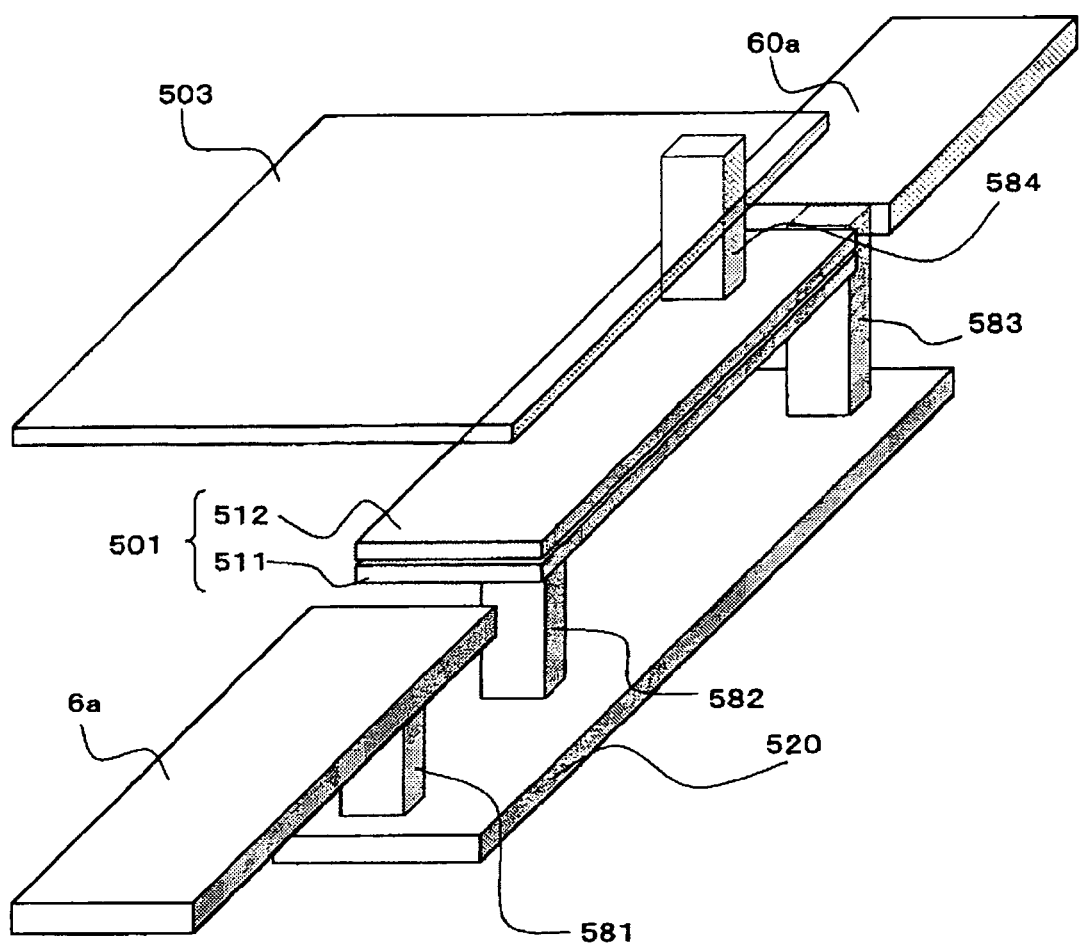
FIG. 6 is a perspective view conceptually illustrating an arrangement relation between the capacitor illustrated in FIGS. 4 and 5 and other components around the capacitor.

The structure of the capacitor 501 formed in the data lines 6*a*, which is a characteristic of the present exemplary embodiment, will now be described in more detail with reference to FIGS. 4 to 6. FIG. 4 is a plan view illustrating the capacitor according to the present embodiment. FIG. 5 is a sectional view taken along the plane B–B' of FIG. 4. FIG. 6 is a perspective view conceptually illustrating the relation between the capacitor according to the present exemplary embodiment and the other components around the capacitor. In FIGS. 5 and 6, respective layers and members are shown in different scales to make them recognizable in the drawings. FIG. 6 represents the arrangement of the capacitor with respect to other components, so that several components illustrated in FIG. 5 such as the dielectric film 75 and the respective interlayer insulating films are not shown.

According to the present exemplary embodiment, the capacitor 501 is formed at the upper end of the data line 6*a* and outside the image display region 10*a*. The sampling circuit 301 and the data line driving circuit 101 are connected to the lower end of the data line 6*a* (see FIG. 1).

The capacitor 501 uses a first conductive layer 511, connected to the data line 6*a*, as a first electrode and a second conductive layer 512, connected to the capacitor electrode wiring line 503 extended so as to be orthogonal to the data line 6*a* and being held at a fixed potential, as the other electrode. The dielectric film 75 is interposed between the first electrode and the other electrode.

The first conductive layer 511 is formed on the first interlayer insulating film 41 as illustrated in FIGS. 5 and 6. For example, as noted by comparing FIG. 5 with FIG. 3, the first conductive layer 511 is made of the same film as the relay layer 71 that forms the storage capacitor 70.

The first conductive layer 511 is connected to the data line 6*a* through the contact holes 581 and 582 and a bypass layer 520. The contact hole 581 penetrates the first interlayer insulating film 41 and the second interlayer insulating film 42. The contact hole 582 penetrates the first interlayer insulating film 41. The bypass layer 520 is formed on the base insulating film 12. As noted by comparing FIG. 5 with FIG. 3, the bypass layer 520 is made of the same film as the scanning line 3*a*. Therefore, the first conductive layer 520 has the same electric potential as the data line 6*a*.

Furthermore, a test circuit wiring line 60*a* is connected to the bypass layer 520 through the contact hole 583. The test circuit wiring line 60*a* is formed of the same film as the data line 6*a*. As illustrated in FIG. 4, a test circuit 701 is connected to the end of the test circuit wiring line 60*a*. The test circuit 701 includes a plurality of TFTs 702. Wiring lines 703 are connected to the TFTs 702 in addition to the test circuit wiring line 60*a*.

The second conductive layer 512 is formed on the dielectric film 75 formed on the first conductive layer 511, to face the first conductive layer 511 as illustrated in FIGS. 5 and 6. The second conductive layer 512 is connected to the capacitor electrode wiring line 503 formed on the second interlayer insulating film 42, through a contact hole 584.

The capacitor electrode wiring line 503, extended so as to be orthogonal to the data line 6*a*, is formed as the same film with the data line 6*a*. For example, when the data line 6*a* is formed including aluminum as mentioned above, the capacitor electrode wiring line 503 is also formed including aluminum. If the capacitor electrode wiring line 503 is formed of a low resistance material such as aluminum, wiring delay does not matter.

The first conductive layer 511, the capacitor electrode wiring line 503, and the above test circuit wiring line 60*a* are formed of the same film as illustrated in FIG. 5.

The capacitor electrode wiring line 503 is connected to a constant-potential source (a first power source in the present invention) for supplying a fixed potential to the counter electrode 21 or a constant-potential source (a second power source in the present invention) for supplying the fixed potential to the data line driving circuit 101 or the scanning line driving circuit 104 (not shown), so that the capacitor electrode wiring line 503 has the fixed potential. As a result, the second conductive layer 512 also has the fixed potential.

According to the present embodiment, in order that the capacitor electrode wiring line 503 and the second conductive layer 512 have the fixed potential, either a power source for letting the counter electrode 21 have the fixed potential or a power source for supplying the fixed potential to the data line driving circuit or the scanning line driving circuit may be used. In either case, it is not necessary to provide a power source for the capacitor electrode wiring line 503 or the second conductive layer 512. As a result, it is possible to simplify the structure of the electro-optical device.

The dielectric film 75 that is the insulating layer of the corresponding capacitor 501 is the same as the dielectric film 75 of the storage capacitor 70, as clearly noted from the name and the reference numeral. That is, the dielectric film 75 is shared by the capacitor 501 and the storage capacitor 70.

The electro-optical device having such a structure has the following effects. First, since the capacitor 501 is formed in the data line 6*a*, it is possible to reduce or prevent the occurrence of the display unevenness on images along the data line 6*a*, which is observed in a conventional technology.

This is because the capacitance around the data line 6a is secured due to the capacitor 501, thereby to prevent the change in the electric potential in the data line 6a and the change in the electric potential in the pixel electrode 9a, which is caused by the change in the electric potential in the data line 6a.

Figure 7:
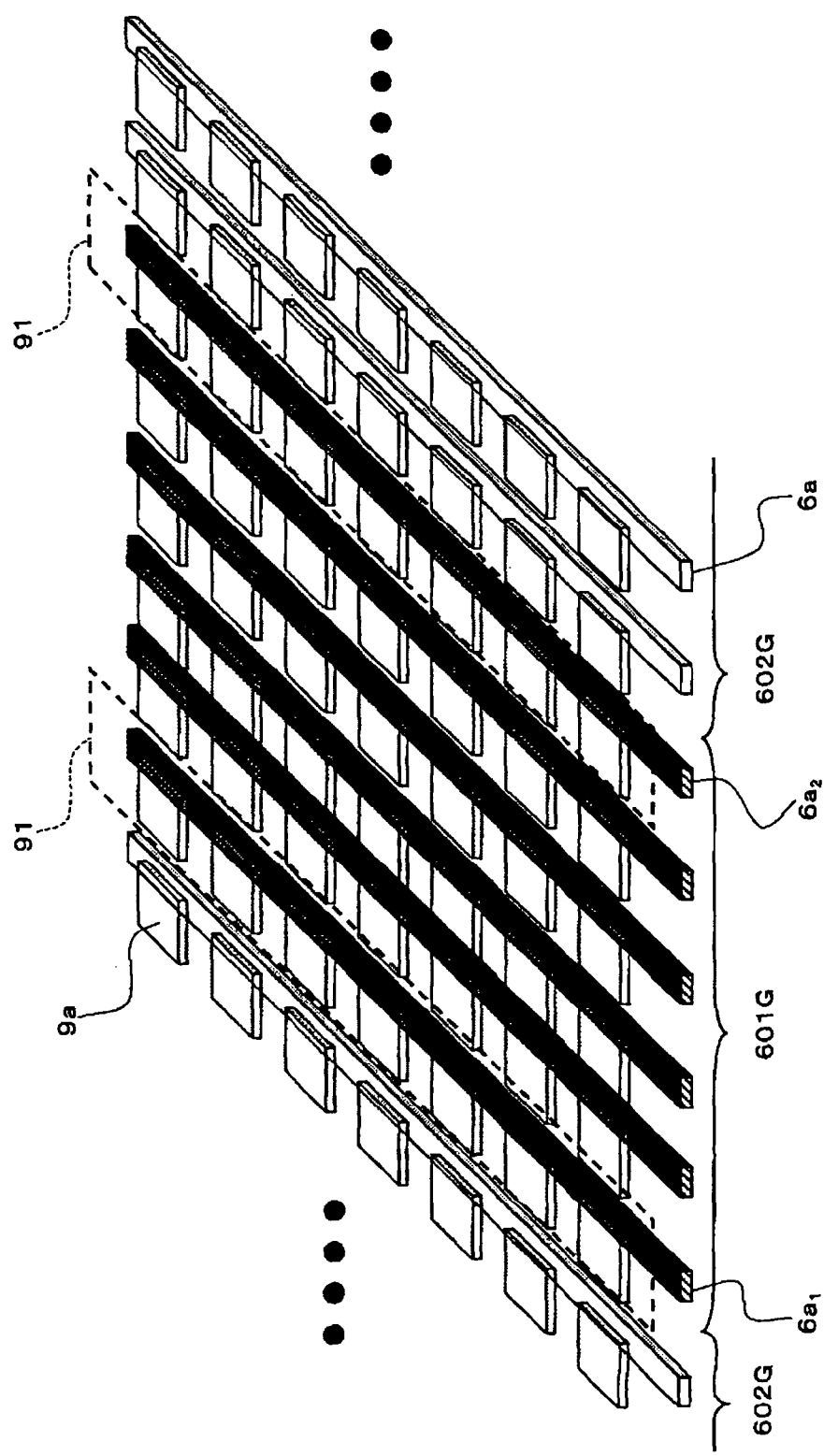
FIG. 7 is a perspective view schematically illustrating a state where image signals are supplied to the data lines.

Such an effect can be realized more efficiently where the image signals are simultaneously supplied to the plurality of data lines 6a adjacent to each other. This is because the above-mentioned display unevenness is more remarkable or recognizable in this case. This will be described with reference to FIG. 7. FIG. 7 is a perspective view schematically illustrating a state where the image signals are supplied to the data lines. It is noted that in FIG. 7, contact holes are not illustrated. Only the data lines 6a and the pixel electrodes 9a that are the minimum necessary components for explaining the main effects according to the present exemplary embodiment are illustrated.

In FIG. 7, in the electro-optical device according to the present exemplary embodiment, the image signals supplied to the data lines 6a are six parallel signals obtained by serial-parallel conversion of one serial signal. For example, the image signals are simultaneously supplied to groups, each of which consists of six data lines 6a. In such a method of supplying the image signals, the image signals are naturally not supplied to the data line 6a that belongs to a non-supplied group 602G adjacent to the supplied group 601G, to which the image signals are actually supplied. In FIG. 7, the blacked-out data lines 6a indicate data lines to which the image signals are actually supplied. The non-blacked-out data lines 6a indicate data lines to which image signals are not supplied (in the next step, for example, the image signals may be supplied to the six data lines 6a in which belong to the non-supplied group 602G on the right side (or on the left side) of the supplied group 601G in FIG. 7).

Here, referring to the supplied group 601G, the change in the electric potential is apt to occur in the pixel electrodes 9a (refer to reference numeral 91) corresponding to the data line $6a_1$ provided in the left end in FIG. 7 and the data line $6a_2$ provided in the right end in FIG. 7. That is, when the capacitance around the data lines $6a_1$ and $6a_2$ (for example, the wiring line capacitance of the data lines or the capacitance generated by overlapping of the data lines with other wiring lines and the counter electrode) is significantly small, the pushdown amount of the image signal electric potential recorded in the data lines $6a_1$ and $6a_2$ becomes larger due to the influence of the parasitic capacitance between the gates and the drains of the TFTs 202 that form the sampling circuit 301. Therefore, the change in the electric potential in the data lines $6a_1$, and $6a_2$ becomes larger. Thus, the change in the electric potential of the pixel electrodes 9a, arranged to correspond to the data lines $6a_1$ and $6a_2$, is caused. As a result, the display unevenness along the data lines $6a_1$, and $6a_2$ occurs on images.

The following equation is established. When the pushdown amount of the electric potential of the image signal recorded in the data line 6a is ΔV.

$$\Delta V = \Delta Vd \times (CGD/(CGD+CST))$$

ΔVd represents the amount of the change in the electric potential in the data lines $6a_1$ and $6a_2$. CGD represents the parasitic capacitance between the gates and the drains of the TFTs 202 that form the sampling circuit 301. CST represents the parasitic capacitance generated by overlapping of the data lines with other wiring lines and the counter electrode 21. As noted from the above equation, when the width of the data lines $6a_1$ and $6a_2$ is reduced, that is, when the capacitance CST is reduced, the influence of the parasitic capacitance CGD becomes larger. Therefore, the push down amount ΔV becomes larger.

Furthermore, significant parasitic capacitance is generated between the data lines 6a and the pixel electrodes 9a because adjacent to the data lines $6a_1$ and $6a_2$, there exist many data lines 6a to which the image signals are not supplied (for example, in FIG. 7, the data lines 6a on the left of the data line $6a_1$ and on the right of the data line $6a_2$). This also brings a situation that the electric potential change is apt to occur in the pixel electrodes 9a denoted by the reference numeral 91 in FIG. 7.

As a result, the electric field corresponding to the image signal is not applied to the corresponding pixel electrode 9a. Therefore, as illustrated in FIG. 7, the display unevenness occurs on images along the data lines $6a_1$ and $6a_2$. Furthermore, where the display unevenness occurs along each group of six data lines 6a, the unevenness is more easily recognizable on images, which is more serious.

However, according to the present exemplary embodiment, as illustrated in FIGS. 1 and 4 to 6, the capacitor 501 is formed in the data line 6a. Therefore, in FIG. 7, it is possible to prevent the change in the electric potential in the data lines 6a that belong to the supplied group 601G, for example, in the data lines $6a_1$ and $6a_2$ provided at both ends of the supplied group 601G. As a result, the electric potential change in the pixel electrodes 9a, which is caused by the change in the electric potential in the data lines $6a_1$ and $6a_2$, is hardly generated.

As mentioned above, according to the electro-optical device of the present exemplary embodiment, it is possible to prevent the occurrence of the display unevenness along the data lines 6a, which is observed in the conventional technology.

Secondly, as noted by comparing FIG. 5 with FIG. 3, the capacitor 501 according to the present exemplary embodiment is formed in the same step as the members that form the storage capacitor 70 of the manufacturing steps. For example, as mentioned above, the first conductive layer 511 is formed as the same film as the relay layer 71. The second conductive layer 512 is formed as the same film as the capacitive line 300. The dielectric film 75 is shared by the capacitor 501 and the storage capacitor 70. According to the present exemplary embodiment, the scanning line 3a and the bypass layer 520 are also formed as the same film. Therefore, the data line 6a, the capacitor electrode wiring line 503, and the test circuit wiring line 60a are formed as the same film.

In this way, according to the present exemplary embodiment, the capacitor and the components related to the capacitor are simultaneously formed of the components formed in the image display region (such as the scanning line 3a, the data line 6a, and the storage capacitor 70). Therefore, it is possible to simplify the manufacturing steps and to reduce the manufacturing costs.

Third, according to the present exemplary embodiment, the sampling circuit 301 and the data line driving circuit 101 are connected to one end of the data lines 6a, while the capacitor 501 and the test circuit 701 are connected to the other end of the data lines 6a. Therefore, the arrangement relation among various components is appropriate. In particular, the electric potential is supplied to the first conductive layer 511 that forms the capacitor 501 after the electric potential is supplied to the pixel electrode 9a connected to the data line 6a. Therefore, it is possible to prevent a negative effect due to the capacitor 501 interposed between the test circuit 701 and the data lines 6a. Furthermore, according to the present exemplary embodiment, the data line 6a is connected to the test circuit 701 through the bypass layer 520. Therefore, it is possible to determine the arrangement among the data lines 6a, the test circuit 701, and the bypass layer 520 without occupying a large area (refer to FIG. 5).

Figure 8:
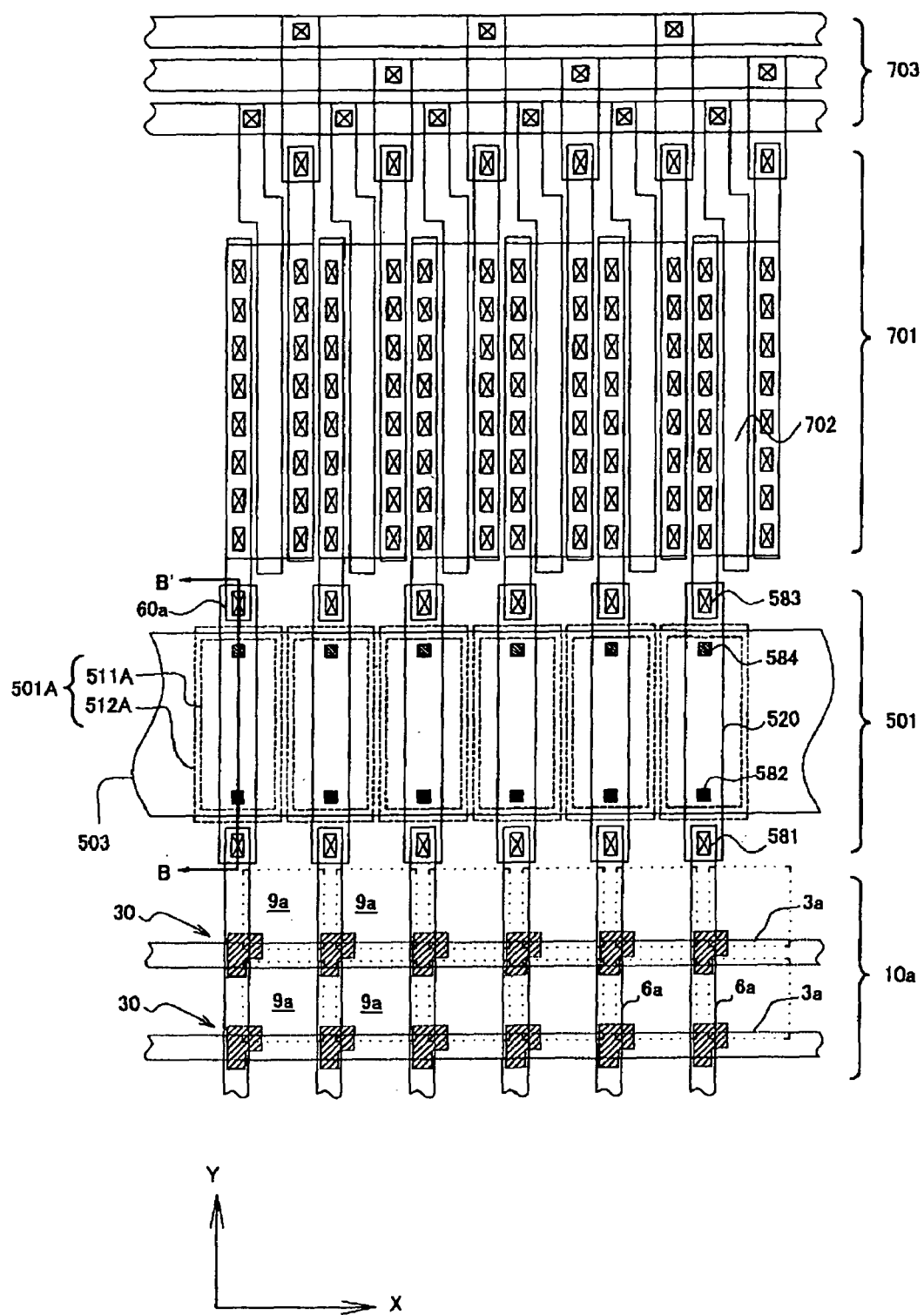
FIG. 8 is a plan view with the same purpose as FIG. 4 where first conductive layers and second conductive layers which are the electrodes of capacitors are formed wider than the data lines.

Although as illustrated in FIG. 4, the capacitor 501 includes the first conductive layer 511 and the second conductive layer 512, which have the same width as the data line 6a, as a pair of electrodes, the present invention is not restricted to such a structure. For example, as illustrated in FIG. 8, with the same purpose as FIG. 4, a capacitor 501A may be formed by including a first conductive layer 511A and a second conductive layer 512A, with a width larger than that of the data line 6a, as a pair of electrodes. According to such a structure, the electrode area and the capacitance value increase compared to the above-mentioned embodiment. Alternatively, it is possible to effectively secure the capacitance even if the distance in the Y direction is small. Therefore, it is possible to miniaturize the electro-optical device. Therefore, according to such a structure, it is possible to secure the capacitance around the data lines 6a, more effectively reducing the possibility of the occurrence of the change in the electric potential in the data line 6a and the pixel electrodes 9a and the occurrence of the display unevenness on images along the data lines 6a, which is caused by the change in the electric potential in the data lines 6a and the pixel electrodes 9a, compared with the above mentioned structures.

Furthermore, as described above, the capacitor 501 includes the first conductive layer 511 and the second conductive layer 512 as a pair of electrodes, however, the present invention is not restricted to such a structure.

Figure 9:
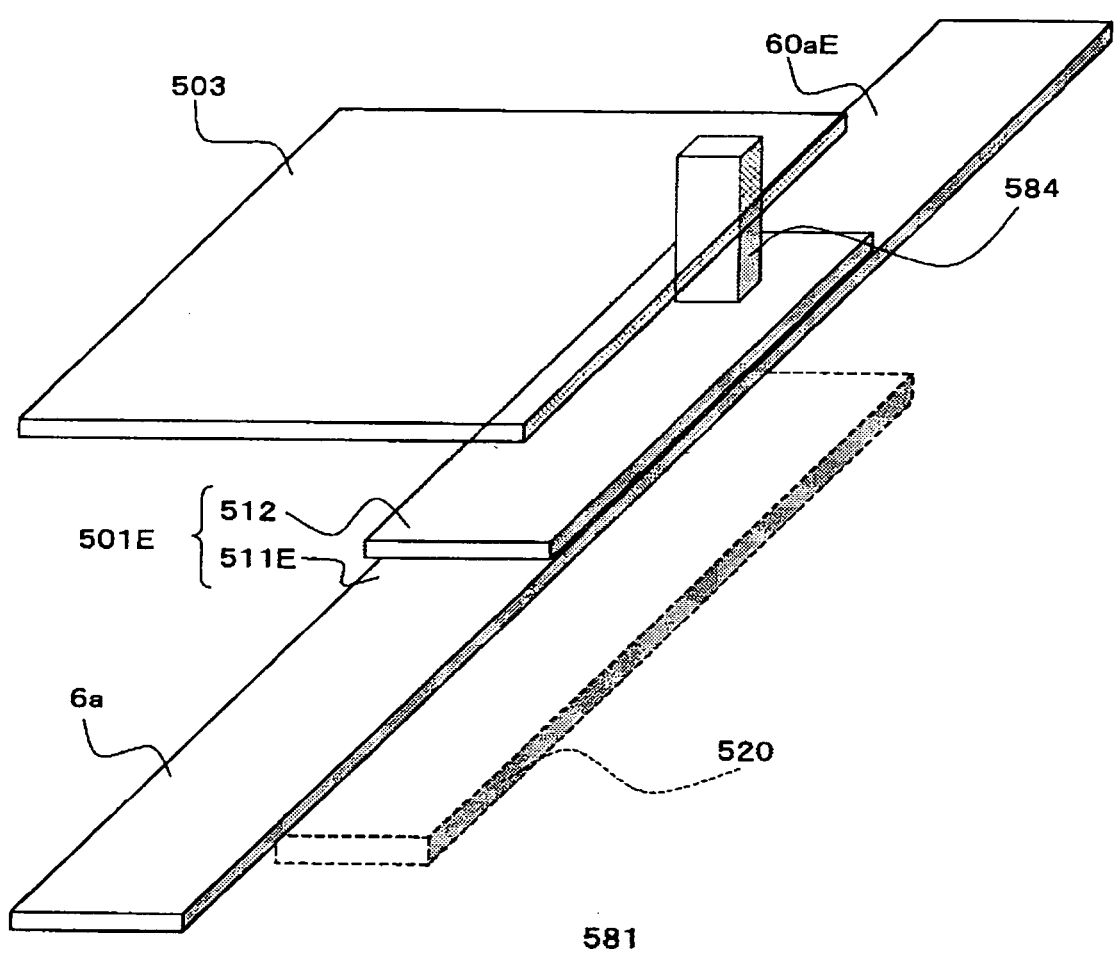
FIG. 9 is a perspective view with the same purpose as FIG. 6 illustrating a case where a part of the data line forms a first electrode of the capacitor according to an exemplary embodiment.

For example, as illustrated in FIG. 9, with the same purpose as FIG. 6, a capacitor 501E may have a structure in which a conductive layer 511E is formed by extending the data line 6a itself. The conductive layer 511E and a test circuit wiring line 60aE are formed of the same material as the data line 6a and are not clearly distinguished from the data line 6a in appearance. For example, in the conductive layer 511E, a part of the data line 6a itself forms the first electrode of the capacitor according to the present invention. In this case, it is not always necessary to form the bypass layer 520 (refer to dotted lines in FIG. 9).

Figure 10:
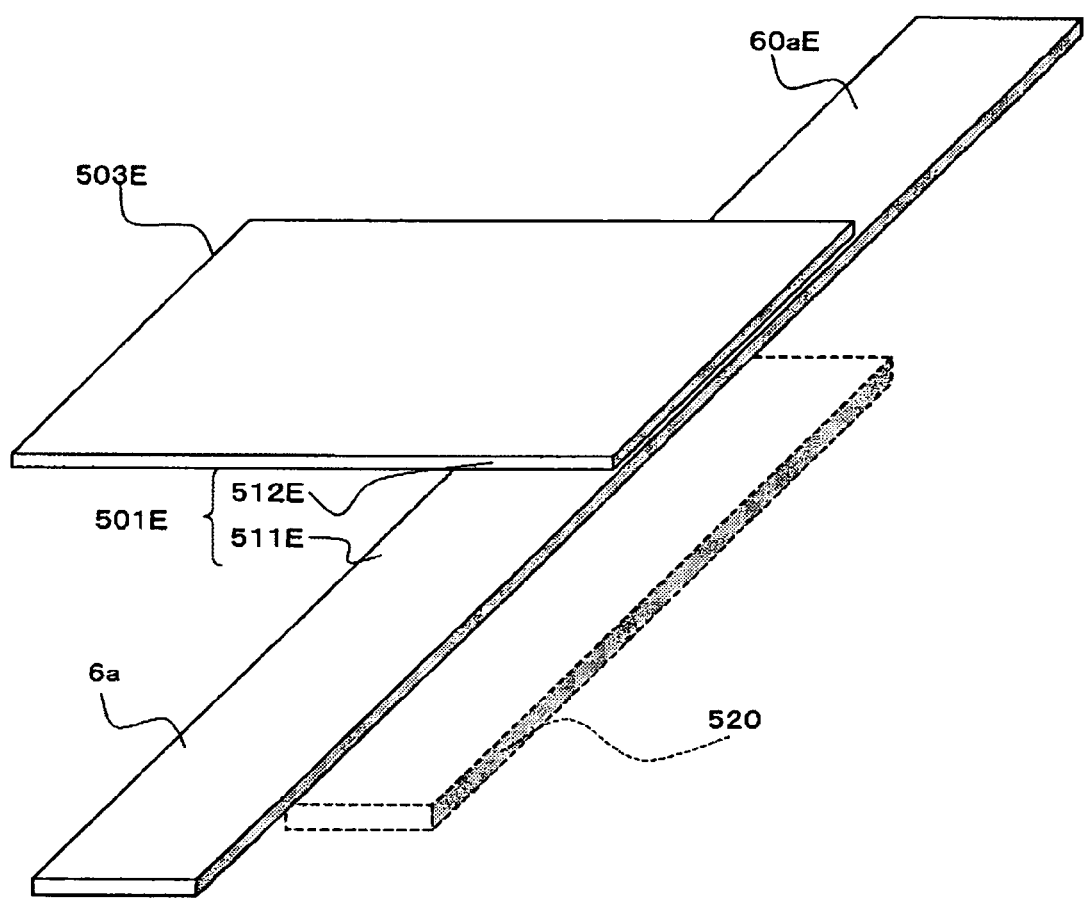
FIG. 10 is a perspective view with the same purpose as FIG. 6 illustrating a case where some of the capacitor electrode wiring lines form another electrode of the capacitor according to an exemplary embodiment.

Furthermore, by modifying the structure illustrated in FIG. 9, a capacitor electrode wiring line 503E may be constructed to function as the above described second conductive layer 512, as illustrated in FIG. 10. The conductive layer 512E is formed of the same material as the capacitor electrode wiring line 503E and is not distinguished from the capacitor electrode wiring line 503E in appearance. For example, a part of the capacitor electrode wiring line 503E, which functions as conductive layer 512E, forms the other electrode of the "capacitor" according to the present invention.

Method of Manufacturing Electro-optical Device

Figure 11:
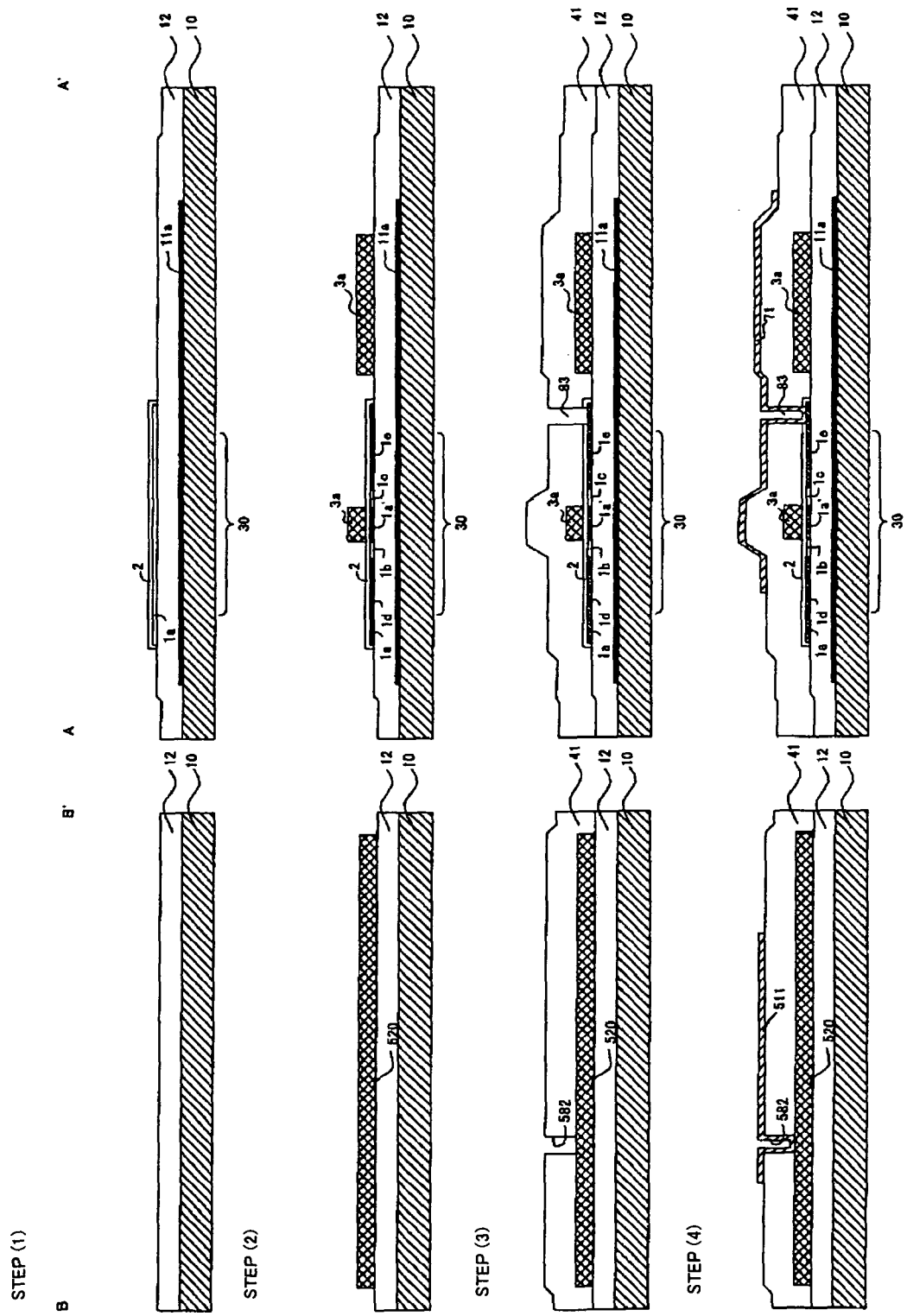
FIG. 11 is a first schematic sequentially illustrating the stacking structure of the electro-optical device in each manufacturing process with respect to the portions (on the right side of the drawing) around a semiconductor layer 1a in the sectional view (on the left side of the drawing) of FIG. 5 and the sectional view of FIG. 3.
Figure 12:
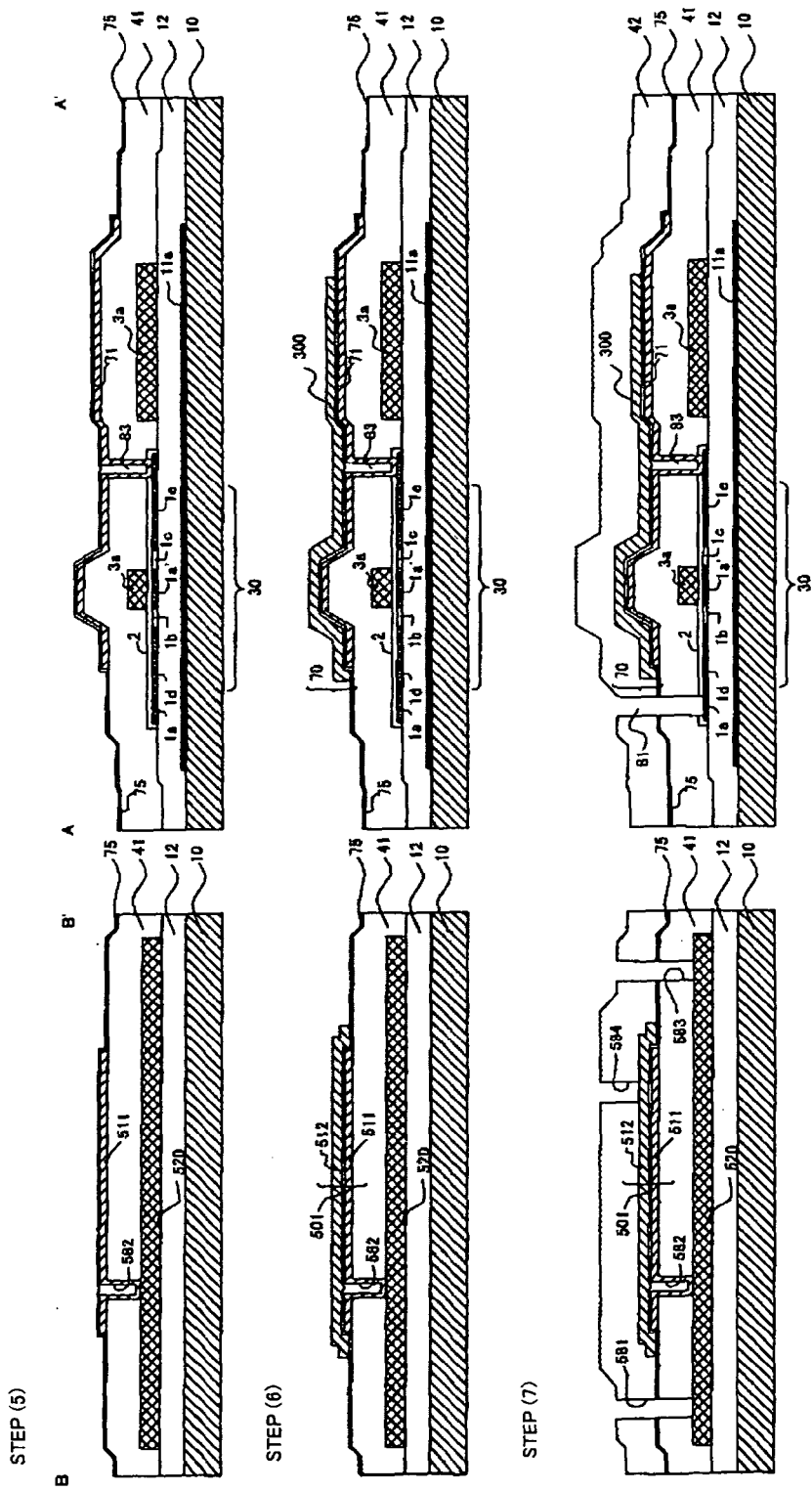
FIG. 12 is a second schematic sequentially illustrating the stacking structure of the electro-optical device in each manufacturing process with respect to the portions (on the right side of the drawing) around a semiconductor layer 1a in the sectional view (on the left side of the drawing) of FIG. 5 and the sectional view of FIG. 3.
Figure 13:
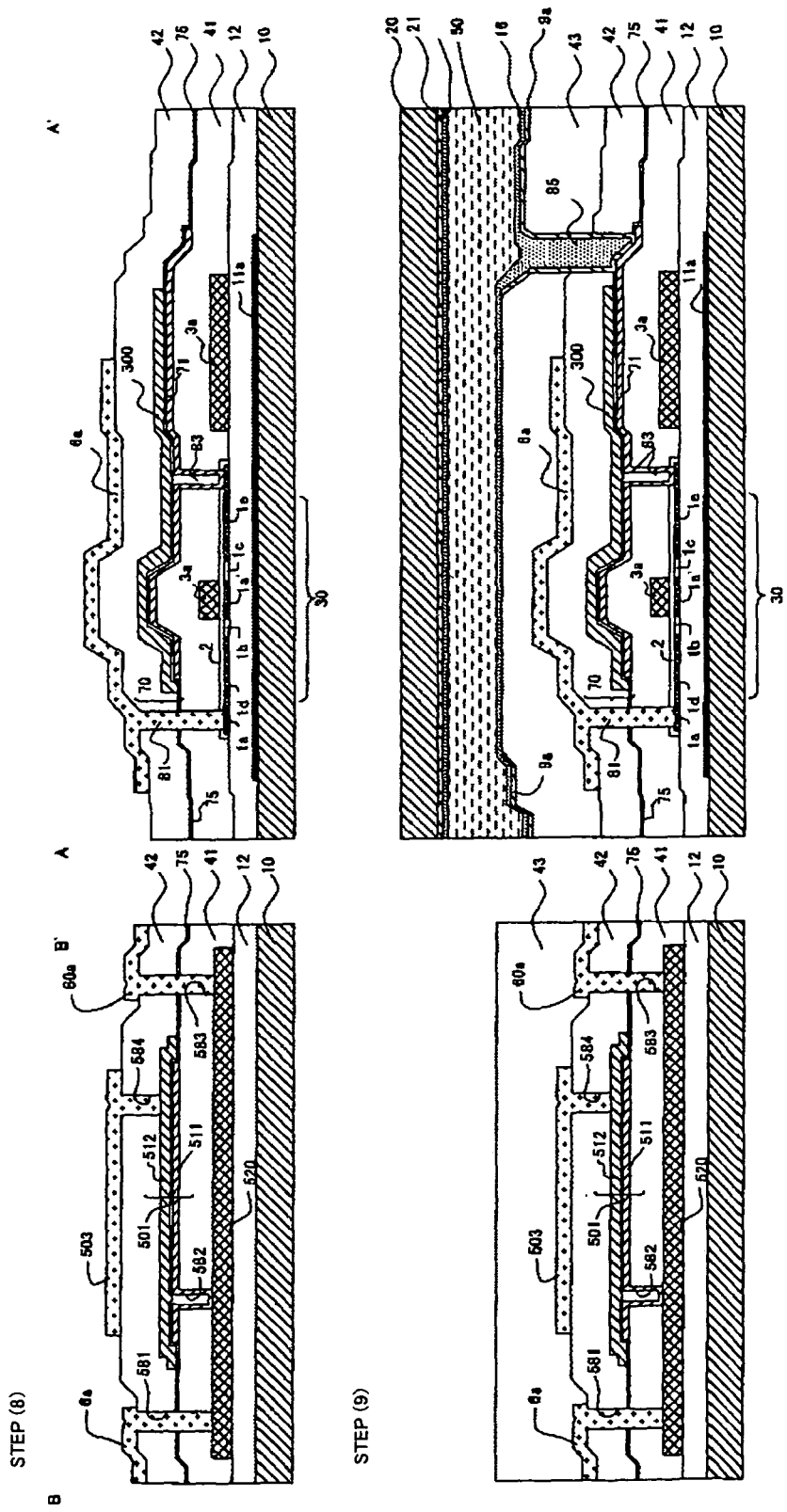
FIG. 13 is a third schematic sequentially illustrating the stacking structure of the electro-optical device in each manufacturing process with respect to the portions (on the right side of the drawing) around a semiconductor layer 1a in the sectional view (on the left side of the drawing) of FIG. 5 and the sectional view of FIG. 3.

A method of manufacturing the electro-optical device according to a present exemplary embodiment will now be described with reference to FIGS. 11 to 13. FIGS. 11 to 13 are schematic process views illustrating the stacking structure of the electro-optical device in each manufacturing process with respect to the portions around a semiconductor layer 1a in the sectional view of FIG. 5 (on the left side) and the sectional view of FIG. 3 (on the right side) in order.

First, as illustrated in the process (1) of FIG. 11, the TFT array substrate 10, such as a quartz substrate, hard glass, and a silicon substrate, is provided. The TFT array substrate 10 is preferably annealed in an inactive gas atmosphere, such as $N_2$, at a high temperature of about 900 to 1,300° C. and pre-processed so that the TFT array substrate 10 is less distorted in a high temperature process performed later. Then, a light shielding film of a thickness of about 100 to 500 nm, preferably, 200 nm is formed in the image display region of the thus processed TFT array substrate 10 by spattering a metal such as Ti, Cr, W, Ta, and Mo or a metal alloy film such as a metal silicide. A lower light shielding film 11a is formed to have a lattice plane by performing photolithography and etching. A base insulating film 12, formed of a silicate glass film such as NSG (non-silicate glass), PSG (phosphor silicate glass), BSG (boron silicate glass), and BPSG (boron phosphor silicate glass), a silicon nitride film, or a silicon oxide film, is formed on the lower light shielding film 11a, for example, by an atmospheric pressure or reduced pressure CVD method using a TEOS (tetra ethyl ortho silicate) gas, a TEB (tetra ethyl borate) gas, and a TMOP (tetra methyl oxy phosphate) gas. The thickness of the base insulating film 12 is, for example, about 500 to 2,000 nm. Furthermore, the base insulating film 12 is formed both inside and outside the image display region.

Next, an amorphous silicon film is formed on the base insulating film 12 in the image display region in a relatively low temperature atmosphere of about 450 to 550° C., preferably about 500° C., by a reduced pressure CVD (for example, CVD of a pressure of about 20 to 40 Pa) using a mono-silane gas and a disilane gas of the flux of about 400 to 600 cc/min. A polysilicon film is solid phase grown until the polysilicon film has a thickness of about 50 to 200 nm, preferably, about 100 nm by annealing the amorphous silicon film in a $N_2$ atmosphere at a temperature of about 600 to 700° C. for 1 to 10 hours, preferably, 4 to 6 hours. A method of solid phase growth of the polysilicon film may be either annealing using RTA or laser annealing using excimer laser. At this time, some dopants of V group elements or III group elements may be slightly doped by ion implantation and the like according to whether the pixel switching TFT 30 is an n-channel type or a p-channel type. Then, a semiconductor layer 1a of a predetermined pattern is formed by photolithography and etching. Next, a lower layer gate insulating film is formed by thermal oxidation of the semiconductor layer 1a that forms the TFT 30 at the temperature of about 900 to 1,300° C., preferably, about 1,000° C. If necessary, an insulating film 2 formed of a single-layer or multi-layer high temperature silicon oxide film (HTO film) or a silicon nitride film (including a gate insulating film) is formed by forming an upper layer gate insulating film by the reduced pressure CVD method. As a result, the semiconductor layer 1a has a thickness of about 30 to 150 nm, preferably, the thickness of about 35 to 50 nm. The insulating film 2 has a thickness of about 20 to 150 nm, preferably, about 30 to 100 nm.

A dopant, such as boron, is doped by implanting ions in a predetermined amount into an n-channel region or a p-channel region in the semiconductor layer 1a in order to control a threshold voltage Vth of the pixel switching TFT 30.

As illustrated in the process (2) of FIG. 11, the polysilicon film is deposited by the reduced pressure CVD method and phosphor (P) is thermally diffused, thereby making the polysilicon film conductive. A doped silicon film obtained by introducing P ions at the same time of forming the polysilicon film may be used instead of thermally diffusing phosphor (P). The thickness of the polysilicon film is about 100 to 500 nm, preferably, about 350 nm. The scanning line 3a of a predetermined pattern is formed including the gate electrode of the TFT 30 by performing photolithography and etching. At this time, according to the present embodiment, the bypass layer 520 is simultaneously formed in the region outside the image display region in forming the scanning line 3a. For example, the bypass layer 520 having a predetermined pattern (refer to FIG. 4) is formed of the same film as the scanning line 3a at the same time of forming the scanning line 3a of a predetermined pattern by performing photolithography and etching.

Next, a lightly doped source region 1b, a lightly doped drain region 1c, a heavily doped source region 1d, and a heavily doped drain region 1e are formed in the semiconductor layer 1a.

A case where the TFT 30 is the n-channel type TFT having an LDD structure will now be described. Dopants of V group elements such as P are doped at a low density (for example, P ions at the dose amount of 1 to $3\times10^{13}$ cm$^2$) using the scanning line 3a (the gate electrode) as a mask in order to form the lightly doped source region 1b and the lightly doped drain region 1c. Thus, the semiconductor layer 1a below the scanning line 3a becomes the channel region 1a'. At this time, the lightly doped source region 1b and the lightly doped drain region 1c are formed in a self-alignment manner because of the scanning line 3a serving as a mask. Next, in order to form the heavily doped source region 1d and the heavily doped drain region 1e, a resister layer, having a flat pattern with a width larger than that of the scanning line 3a, is formed on the scanning line 3a. The dopants of the V group elements such as P are doped at a high density (for example, the P ions at the dose amount of 1 to $3\times10^{15}$ cm$^2$).

It is noted that doping is not necessarily performed in two steps at a low density and a high density. For example, the TFT having an offset structure may be formed without performing a light doping. A self-align type TFT may be formed using the scanning line 3a (the gate electrode) as the mask by an ion implantation technology using P and B ions. The scanning line 3a has lower resistance by doping the dopant.

Next, as illustrated in the process (3) of FIG. 11, a first interlayer insulating film 41 formed of a silicate glass film such as NSG, PSG, BSG, and BPSG, a silicon nitride film, or a silicon oxide film is formed on the scanning line 3a by the atmospheric pressure or reduced pressure CVD method using, for example, the TEOS gas, the TEB gas, and the TMOP gas. The thickness of the first interlayer insulating film 41 is, for example, about 500 to 2,000 nm. Then, the first interlayer insulating film 41 is preferably annealed at a high temperature of about 800° C. to improve the quality of the first interlayer insulating film 41.

Then, a contact hole 83 is formed in the first interlayer insulating film 41 by dry etching, such as reactive ion etching and reactive ion beam etching. At this time, according to the present embodiment, the contact hole 582 is also formed so as to reach the bypass layer 520 in the region excluding the image display region.

Next, as illustrated in the process (4) of FIG. 11, a polysilicon film or a metal alloy film formed of a metal such as Ti, Cr, W, Ta, and Mo or metal silicide is formed on the first interlayer insulating film 41 by a spattering method to have a thickness of about 100 to 500 nm. A relay layer 71 having a predetermined pattern is formed by photolithography and etching. At this time, according to the present exemplary embodiment, the first conductive layer 511 is formed in the region excluding the image display region at the same time the relay layer 71 is formed. For example, the first conductive layer 511 having a predetermined pattern (refer to FIG. 4) is formed of the same film as the relay layer 71 at the same time of forming the relay layer 71 of a predetermined pattern by photolithography and etching.

Next, as illustrated in the process (5) of FIG. 12, a dielectric film 75 formed of, an HTO film, a silicon nitride film, and a TaOx film, by a reduced pressure CVD method or a plasma CVD method, is formed on the relay layer 71. The dielectric film 75 may be formed either as a single-layer film or a multi-layer film, like in the insulating film 2. The dielectric film 75 may be formed by any suitable technology used for forming a TFT gate insulating film. Since the thinner the dielectric film 75 is, the larger the storage capacitor 70 is, it is advantageous that the dielectric film 25 is formed to have a very thin thickness of no more than 50 nm so that any defect such as destruction of a film is not generated. According to the present exemplary embodiment, the dielectric film 75 is also formed in the region excluding the image display region. Therefore, the dielectric film 75 is formed not only on the relay layer 71 but also on the first conductive layer 511 formed of the same film as the relay layer 71.

Next, as illustrated in the process (6) of FIG. 12, a metal alloy film formed of a metal such as Al, Ti, Cr, W, and Ta, is formed on the dielectric film 75 by the spattering method, to have a thickness of about 100 to 500 nm. Then a capacitive line 300 of a predetermined pattern is formed by photolithography and etching. As a result, the storage capacitor 70 is completed with the capacitive line 300, and the above-mentioned relay layer 71 and the dielectric film 75.

Furthermore, according to the present embodiment, the second conductive layer 512 is formed in the region excluding the image display region at the same time as forming the capacitive line 300. For example, the second conductive layer 512 having a predetermined pattern (refer to FIG. 4) is formed of the same film as the line 300, while forming the capacitive line 300 of a predetermined pattern by photolithography and etching. Therefore, according to the present exemplary embodiment, when the storage capacitor 70 is completed, the capacitor 501, which is formed of the first conductive layer 511, the second conductive layer 512, and the dielectric film 75, is simultaneously completed.

Next, as illustrated in the step (7) of FIG. 12, a second interlayer insulating film 42 formed of a silicate glass film, such as NSG, PSG, BSG, and BPSG, a silicon nitride film or a silicon oxide film is formed by, for example, the atmospheric pressure or reduced pressure CVD method using a TEOS gas. The thickness of the second interlayer insulating film 42 is, for example, about 500 to 1,500 nm. Then, a contact hole 81 is formed in the second interlayer insulating film 42 by dry etching, such as reactive ion etching and reactive ion beam etching. At this time, according to the present exemplary embodiment, contact holes 581 and 583 are simultaneously formed in the region excluding the image display region so as to reach the bypass layer 520. A contact hole 584 is further formed in the second interlayer insulating film 42 in the region excluding the image display region so as to reach the second conductive layer 512.

Next, as illustrated in the process (8) of FIG. 13, a metal film made of a low resistance metal such as light shielding Al or metal silicide is deposited on the entire surface of the second interlayer insulating film 42 by the spattering method to have a thickness of about 100 to 500 nm, preferably, about 300 nm. Then, the data line 6a having a predetermined pattern is formed by photolithography and etching. In this case, according to the present exemplary embodiment, the test circuit wiring line 60a connected to the capacitor electrode wiring line 503 and the test circuit 701 is formed in the region excluding the image display region at the same time as forming the data line 6a. For example, the capacitor electrode wiring line 503 and the test circuit wiring line 60a of a predetermined pattern (refer to FIG. 4) are formed of the same film as the data line 6a, at the same time as forming the data line 6a of a predetermined pattern by photolithography and etching.

Next, as illustrated in the process (9) of FIG. 13, a third interlayer insulating film 43 formed of a silicate glass film, such as NSG, PSG, BSG, and BPSG, a silicon nitride film, or a silicon oxide film by the atmospheric pressure or reduced pressure CVD method using a TEOS gas is formed to cover the data line 6a. The thickness of the third interlayer insulating film 43 is, for example, about 500 to 1,500 nm. Then, a contact hole 85 (not shown in FIG. 13, refer to FIGS. 1 to 3) is formed in the third interlayer insulating film 43 by performing dry etching, such as reactive ion etching and reactive ion beam etching. After that, a transparent conductive film such as an ITO film is accumulated on the third interlayer insulating film 43 by the sputtering process to have a thickness of about 50 to 200 nm. Furthermore, the pixel electrode 9a is formed by photolithography and etching. When the electro-optical device of the invention is used as a reflective electro-optical device, the pixel electrode 9a may be made of an opaque material having a high reflection rate such as Al.

Finally, an alignment film 16 is formed by coating the pixel electrode 9a with a polyimide-based coating solution to make an alignment film and performing rubbing on the alignment film in a predetermined direction so as to have a predetermined pre-tilt angle.

With respect to a counter substrate 20, a glass substrate is prepared, at first, and a light shielding film as a frame is formed on the glass substrate by spattering metal chrome, for example, and performing photolithography and etching. The light shielding film is not necessarily conductive and may be formed of a metal such as Cr, Ni, and Al or resin black obtained by dispersing carbon or Ti in a photoresist.

Then, a counter electrode 21 is formed by depositing a transparent conductive film such an ITO film on the entire surface of the counter substrate 20 using the spattering method to have a thickness of about 50 to 200 nm. Furthermore, an alignment film 22 is formed by coating the entire surface of the counter electrode 21 with a polyimide-based coating solution for alignment film and performing rubbing on the counter electrode 21 in a predetermined direction to have a predetermined pre-tilt angle.

Finally, the TFT array substrate 10 and the counter substrate 20 on which various layers are formed, as mentioned above, are attached to each other by a sealing material so that the alignment films 16 and 22 face to each other. Then, a liquid crystal layer 50 of a predetermined thickness is formed by injecting liquid crystal formed of a mixture of a plurality of kinds of nematic liquid crystals into a space between the both substrates by vacuum aspiration and the like.

The electro-optical device according to the first exemplary embodiment can be manufactured by the above manufacturing process.

As described above, according to the method of manufacturing the electro-optical device of the present exemplary embodiment, the members that form the capacitor 501 and the members that form the storage capacitor 70 are formed in the same step of the manufacturing process. To be specific, as mentioned above, the first conductive layer 511 is formed of the same film as the relay layer 71. The second conductive layer 512 is formed of the same film as the capacitive line 300. The dielectric film 75 is shared by the capacitor 501 and the storage capacitor 70. According to the present exemplary embodiment, the scanning line 3a and the bypass layer are further formed of the same film. The data line 6a, the capacitor electrode wiring line 503, and the test circuit wiring line 60a are formed of the same film.

Accordingly, in the present exemplary embodiment, the capacitor 501 and the components related to the capacitor 501 are formed at the same time of forming the components formed in the image display region (the scanning line 3a, the data line 6a, the storage capacitor 70, and the like). Therefore, it is possible to simplify the manufacturing steps or to reduce the manufacturing costs by just that much.

(Entire Structure of Electro-optical Device)

Figure 14:
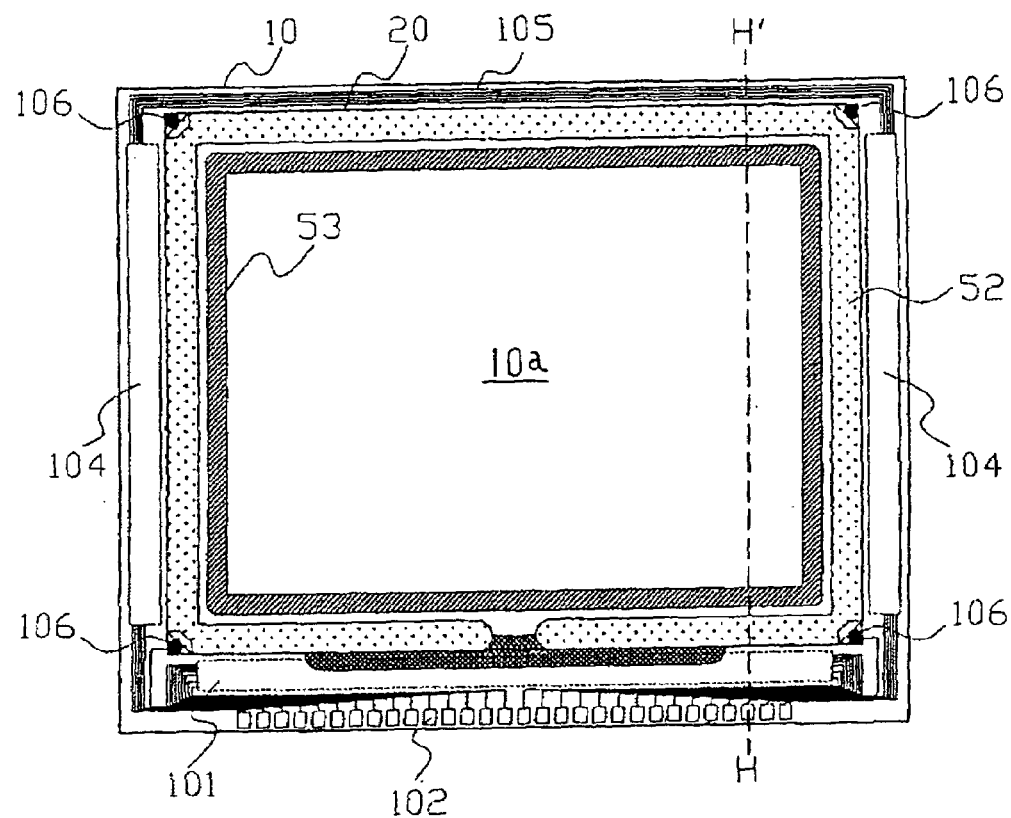
FIG. 14 is a plan view illustrating a TFT array substrate in the electro-optical device according to an exemplary embodiment of the present invention together with the respective components formed on the TFT array substrate when viewing from a counter substrate.
Figure 15:
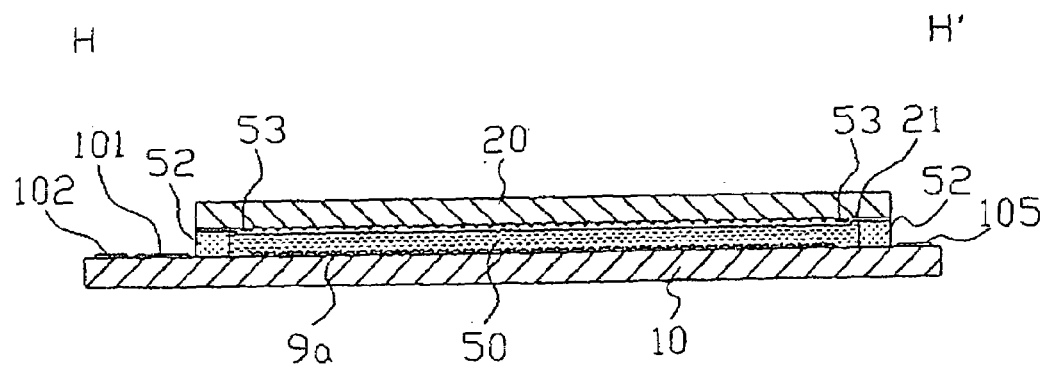
FIG. 15 is a sectional view taken along plane H–H' of FIG. 14.

The entire structure of the electro-optical device according to the present exemplary embodiment will now be described with reference to FIGS. 14 and 15. FIG. 14 is a plan view illustrating the TFT array substrate together with the respective components formed on the TFT array substrate when viewed from the counter substrate 20 side. FIG. 15 is a sectional view taken along the plane H–H' shown in FIG. 14.

In FIGS. 14 and 15, in the electro-optical device according to the present exemplary embodiment, the TFT array substrate 10 and the counter substrate 20 are arranged to face each other. The liquid crystal layer 50 is sealed between the TFT array substrate 10 and the counter substrate 20. The TFT array substrate 10 and the counter substrate 20 are attached to each other by a sealing material 52 provided in a sealing region around the image display region 10a.

The sealing material 52 is formed of, for example, ultraviolet curable resin or thermosetting resin in order to attach both substrates to each other, and is hardened by ultraviolet rays and heating. Gap-maintaining materials (spacers) such as glass fiber or glass beads are scattered into the sealing material 52 to keep a predetermined distance between the substrates (a gap between substrates) when the electro-optical device according to the present exemplary embodiment is applied to a small liquid crystal device such as a projector, which performs enlarged display. Alternatively, when the corresponding electro-optical device is applied to a liquid crystal device for performing large-sized and non-magnified display such as liquid crystal display or a liquid crystal TV set, such gap-maintaining materials may be included in the liquid crystal layer 50.

In a region outside the sealing material 52, a data line driving circuit 101 for driving the data lines 6a by supplying the image signals to the data lines 6a at predetermined timing and an external circuit connecting terminal 102, are provided along one side of the TFT array substrate 10. A scanning line driving circuit 104 for driving the scanning lines 3a by supplying the scanning signals to the scanning lines 3a at predetermined timing is provided along two sides adjacent to the one side.

If the delay of the scanning signals supplied to the scanning lines 3a does not matter, the scanning line driving circuit 104 may be provided on only one side of the image display region 10a. Furthermore, the data line driving circuit 101 may be arranged on both sides along the image display region 10a.

A plurality of wiring lines 105 for connecting the respective scanning line driving circuits 104 provided on the both sides of the image display region 10a are provided on the remaining one side of the TFT array substrate 10. A conductive material 106 for electrically connecting the TFT array substrate 10 to the counter substrate 20 is provided in at least one of the corners of the counter substrate 20.

In FIG. 15, an alignment film is formed on the pixel electrodes 9a, after the pixel switching TFTs, the wiring lines, such as the scanning lines, and the data lines are formed on the TFT array substrate 10. An alignment film is formed on the uppermost portion in addition to the counter electrode 21 on the counter substrate 20. The liquid crystal layer 50 is made of one nematic liquid crystal or liquid crystal obtained by a mixture of various kinds of nematic liquid crystal and has a predetermined alignment between the pair of alignment films.

The sampling circuit for supplying the image signals to the plurality of data lines 6a at predetermined timing, a precharge circuit for supplying precharge signals of a predetermined voltage level to the plurality of data lines 6a prior to the image signals, the test circuit for checking the quality and the defect of the corresponding electro-optical device during the manufacturing or forwarding, and the like, may be formed on the TFT array substrate 10 in addition to the data line driving circuit 101 and the scanning line driving circuit 104.

In the respective exemplary embodiments, the data line driving circuit 101 and the scanning line driving circuit 104 may be electrically and mechanically connected to a driving LSI mounted on a TAB (tape automated bonding) substrate through an isotropic conductive film provided around the TFT array substrate 10, instead of providing the data line driving circuit 101 and the scanning line driving circuit 104 on the TFT array substrate 10. Furthermore, a polarization film, a retardation film, a polarizer and the like are provided on the light entering side of the counter substrate 20 and light exiting side of the TFT array substrate 10 in a predetermined direction, depending on an operation mode such as a TN (twisted nematic) mode, a VA (vertically aligned) mode, and a PDLC (polymer dispersed liquid crystal) mode, or a normally white mode and a normally black mode.

Electronic Apparatus

Figure 16:
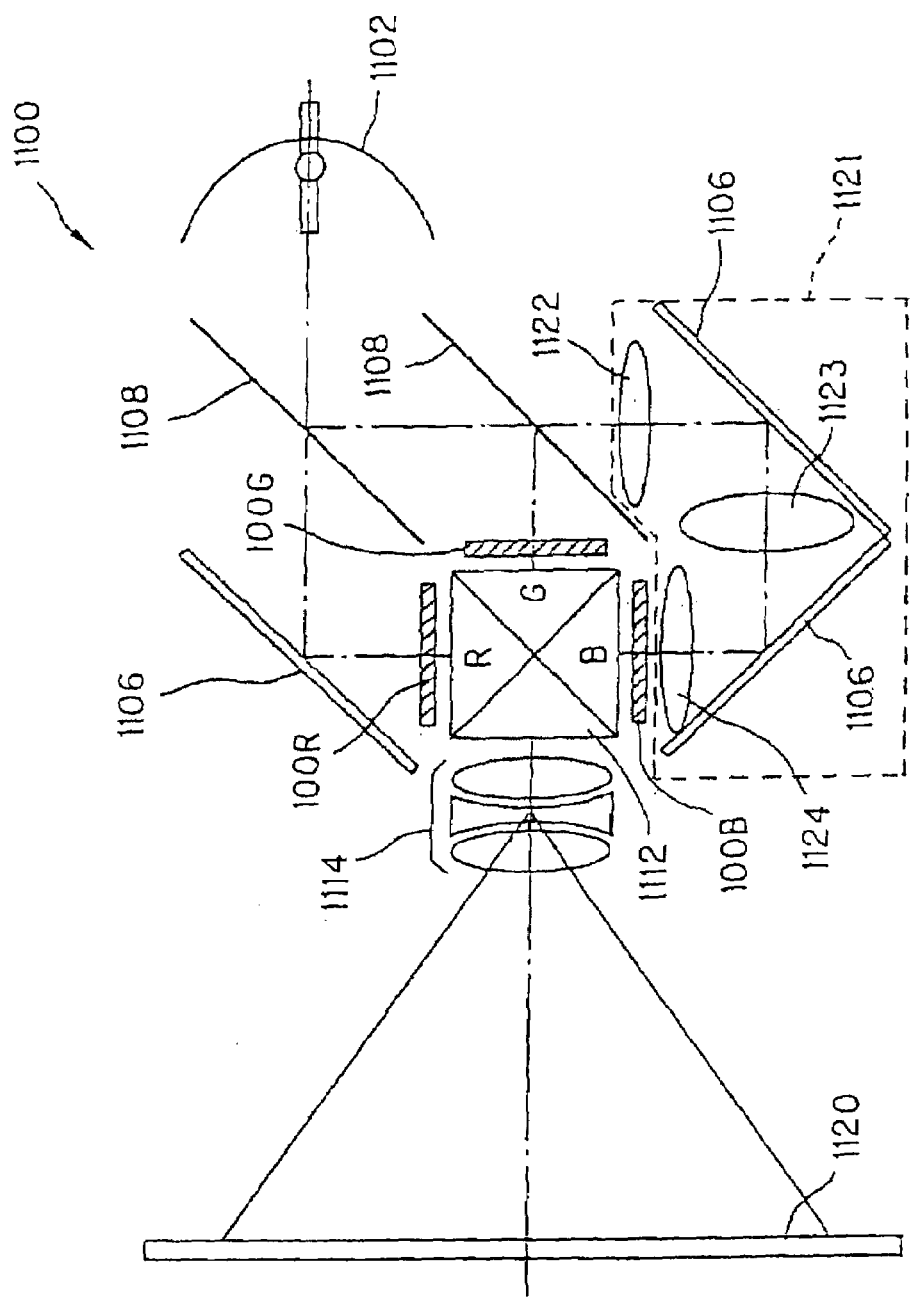
FIG. 16 is a schematic sectional view illustrating a color liquid crystal projector that is an example of a projection type color display device of an exemplary embodiment of an electronic apparatus according to the present invention.

The entire structure, in particular, the optical structure of an exemplary embodiment of a projection type color display device, which is an example of the electronic apparatus using the above-mentioned electro-optical device as a light valve, will now be described. FIG. 16 is a schematic sectional view of the projection type color display device.

In FIG. 16, a liquid crystal projector 1100, that is an example of the projection type color display device according to the present exemplary embodiment, includes three liquid crystal modules each including a liquid crystal device whose driving circuit is mounted on the TFT array substrate and the three liquid crystal modules are used as RGB light valves 100R, 100G, and 100B. In a liquid crystal projector 1100, when projection light is emitted from a lamp unit 1102 of a white light source such as a metal halide lamp, the light is divided into optical components R, G, and B corresponding to the three primary colors of RGB by three mirrors 1106 and two dichroic mirrors 1108. The respective color light components are leaded to the light valves 100R, 100G, and 100B correspondingly. In this case, the light B is led through a relay lens system 1121 formed of an incidence lens 1122, a relay lens 1123, and an emission lens 1124, in order to prevent optical loss caused by a long optical path. The optical components corresponding to the three primary colors modulated by the light valves 100R, 100G, and 100B, respectively, are synthesized by a dichroic prism 1112 to be projected to a screen 1120 through a projection lens 1114 as a color image.

The present invention is not restricted to the above exemplary embodiments and can be modified without departing from the spirit and scope of the invention as defined by the appended claims and the description as a whole. The electro-optical device, the method of manufacturing the same, and the electronic apparatus that accompany such modifications are included in the scope of the present invention.

What is claimed is:

1. An electro-optical device, comprising:
   data lines extending in a predetermined direction;
   scanning lines crossing the data lines;
   a display region including pixel electrodes, pixel switching elements disposed in correspondence with intersections of the scanning lines and the data lines, and storage capacitors, the storage capacitors including electrodes separated by a dielectric film, image signals from the data lines being supplied to the pixel electrodes through corresponding pixel switching elements;
   capacitor electrode wiring lines extending in a direction crossing the data lines;
   a data line driving circuit that drives the data lines, the data line driving circuit being located at one side of the display region; and
   capacitors located external to the display region at the opposite side of the display region than the data line driving circuit, the capacitors including first electrodes and second electrodes, the first electrodes including conductive layers connected to the data lines without any switching element between the conductive layers and the data lines, the second electrodes including other conductive layers connected to the capacitor electrode wiring lines, the first and second electrodes of the capacitors being separated by the same dielectric film of the storage capacitors in the display region.

2. The electro-optical device according to claim 1, the capacitor electrode wiring lines having a fixed potential.

3. The electro-optical device according to claim 2, further comprising;
   a substrate;
   a counter substrate facing the substrate;
   a counter electrode formed on the counter substrate and arranged to face the pixel electrodes;
   a driving circuit arranged on either the counter substrate or the substrate that drives at least one of the scanning lines, the data lines, and the pixel electrodes;
   a first power source that supplies a fixed potential to the counter electrode; and
   a second power source that supplies a fixed potential to the driving circuit,
   the capacitor electrode wiring lines being connected to the first power source or the second power source to have a fixed potential.

4. The electro-optical device according to claim 1, the capacitor electrode wiring lines being made of a low resistance material.

5. The electro-optical device according to claim 1, further comprising:
   the data line driving circuit being located at one end of the data lines; and
   a test circuit that checks the operation of the electro-optical device at the other end of the data lines.

6. The electro-optical device according to claim 1, the storage capacitors are connected to the pixel electrodes and the pixel switching elements, such that, during manufacturing, at least some of the members forming the capacitors can be formed in the same step as at least some of the members forming the storage capacitors.

7. The electro-optical device according to claim 1, such that during manufacturing, the capacitor electrode wiring lines and the data lines can be formed in the same step.

8. The electro-optical device according to claim 1, further comprising:
   bypass layers connected to the data lines and the conductive layers, such that, during manufacturing the bypass layers are formed in the same step as the scanning lines.

9. The electro-optical device according to claim 8, further comprising:
   a test circuit that checks the operation of the capacitors and the electro-optical device at the other end of the data lines, the test circuit being connected to the data lines through the bypass layers, the data lines driving circuit drives the data lines at one end of the data lines.

10. The electro-optical device according to claim 1, the data lines being divided into a plurality of groups, to which image signals are simultaneously supplied.

11. An electronic apparatus comprising:
    an electro-optical device according to claim 1.

12. The electro-optical device according claim 1, the first electrodes of the capacitors being electrically connected to the data lines by a conductive bypass layer located in a layer vertically different from the layer of the first electrodes and the data lines.

* * * * *